(12) United States Patent
Hutton et al.

(10) Patent No.: US 9,106,229 B1
(45) Date of Patent: Aug. 11, 2015

(54) PROGRAMMABLE INTERPOSER CIRCUITRY

(71) Applicant: Altera Corporation, San Jose, CA (US)

(72) Inventors: Michael David Hutton, Mountain View, CA (US); Richard Arthur Grenier, San Jose, CA (US)

(73) Assignee: Altera Corporation, San Jose, CA (US)

( * ) Notice: Subject to any disclaimer, the term of this patent is extended or adjusted under 35 U.S.C. 154(b) by 216 days.

(21) Appl. No.: 13/829,965

(22) Filed: Mar. 14, 2013

(51) Int. Cl.
*H03K 19/173* (2006.01)
*G06F 17/50* (2006.01)

(52) U.S. Cl.
CPC .......... *H03K 19/173* (2013.01); *G06F 17/5077* (2013.01)

(58) Field of Classification Search
None
See application file for complete search history.

(56) References Cited

U.S. PATENT DOCUMENTS

| 6,072,233 | A * | 6/2000 | Corisis et al. ................. 257/686 |
| 7,619,441 | B1 * | 11/2009 | Rahman et al. ................. 326/38 |
| 2013/0181257 | A1 * | 7/2013 | Ngai ............................. 257/209 |

OTHER PUBLICATIONS

Chandrasekar et al., U.S. Appl. No. 13/646,477, filed Oct. 5, 2012.
Wang et al., U.S. Appl. No. 13/485,768, filed May 31, 2012.
Cashman, U.S. Appl. No. 13/669,244, filed Nov. 5, 2012.
Hutton et al., U.S. Appl. No. 13/345,436, filed Jan. 6, 2012.

* cited by examiner

*Primary Examiner* — Crystal L Hammond
(74) *Attorney, Agent, or Firm* — Treyz Law Group; Jason Tsai

(57) ABSTRACT

A multichip package that includes a programmable interposer is provided. Multiple integrated circuits may be mounted on the interposer. Active circuitry may also be embedded in the interposer device to facilitate protocol-based communications, debugging, and other desired circuit operations. The interposer device may include programmable interconnect routing circuitry that serves primarily to provide routing for the different circuits within the multichip package. A design tool may be used to design the interposer device. The design tool may include a standard die footprint library from which standard interface templates can be selected when designing an interposer device that has to communicate various on-interposer integrated circuits. The use of standard die footprints may simplify the design of interposers by enabling a family of devices to interface with a given interposer.

21 Claims, 18 Drawing Sheets

US 9,106,229 B1

PROGRAMMABLE INTERPOSER CIRCUITRY

BACKGROUND

An integrated circuit package generally includes, among others, an integrated circuit die and a substrate on which the die is mounted. The die is typically coupled to the substrate through wires or solder bumps. Signals from the integrated circuit die may then travel through the wires or solder bumps to the substrate.

As integrated circuit technology scales towards smaller device dimensions, device performance continues to improve at the expense of increased power consumption. In an effort to reduce power consumption, more than one die may be placed within a single integrated circuit package (i.e., a multichip package). As different types of devices cater to different types of applications, more dies may be required in some systems to meet the requirements of high performance applications. Accordingly, to obtain better performance and higher density, an integrated circuit package may include multiple dies arranged laterally along the same plane or may include multiple dies stacked on top of one another.

Multichip packages have been developed that include multiple dies mounted on top of a silicon interposer. The silicon interposer typically includes fixed connections that connect one die to another in a multichip package. Because the connections are fixed, it is oftentimes challenging to design the silicon interposer that has to be able to interface with different types of dies that are oftentimes manufactured by multiple parties with different timelines.

SUMMARY

This relates generally to multichip packages and, more particularly, to multichip packages with configurable interposer integrated circuit devices. Multiple integrated circuit dies may be mounted on top of the interposer within the housing of the multichip package. The interposer may be mounted on top of a package substrate. If desired, multiple interposers may be stacked vertically with respect to one another.

Microbumps may be interposed between the interposer and the on-interposer dies, whereas flip-chip bumps (e.g., bumps that are relatively larger than the microbumps) may be interposed between the interposer and the package substrate. The interposer may include input-output pins configured to interface with the on-interposer integrated circuit dies via the microbumps. The interposer may include programmable interconnect circuitry (sometimes referred to as programmable interconnect routing fabric) that serves to provide desired routing connections for the on-interposer integrated circuit dies.

The programmable interconnect circuitry may include vertical and horizontal routing paths, configurable multiplexers that are interposed in the routing paths, configuration memory elements that store control bits for controlling the configurable multiplexers, and a configuration controller that is used to load the control bits into the configuration memory elements. The programmable interconnect circuitry may include paths for connecting different on-interposer dies, paths for self-routing (e.g., paths that are coupled between input-output pins associated with a single on-interposer die), and paths for connecting the on-interposer dies to off-interposer devices.

Active circuitry may optionally be embedded as an integral part of the interposer. As an example, debug circuitry may be embedded in the interposer for debugging various on-interposer dies. As another example, various interface circuits that implement desired input-output communications protocols may be embedded in the interposer.

In another suitable embodiment of the present invention, a method for designing a multichip package using computer-aided design (CAD) tools implemented on computing equipment is provided. The CAD tools may include a schematic capture tool that assists a circuit designer in designing a multichip package having a configurable interposer. The schematic capture tool may allow a user an opportunity to specify different intellectual property (IP) blocks (e.g., programmable integrated circuits, application specific integrated circuits, memory devices, network processing units, debugging circuitry etc.) to be placed within a multichip package, to select from a library of standardize die footprints (e.g., a library that contains standard interface formats each of which specifies a respective predetermined input-output pinout arrangement for a family of dies), and to make desired routing connections between the selected die footprints.

The CAD tools may then be used to perform circuit synthesis, physical routing, and timing analysis and may generate a corresponding configuration data file that includes data for configuring the programmable interconnect circuitry so that the programmable interconnect circuitry provides the desired interposer routing connections.

Further features of the present invention, its nature and various advantages will be more apparent from the accompanying drawings and the following detailed description.

DETAILED DESCRIPTION

Embodiments of the present invention relate to integrated circuits, and more particularly, to multichip packages that include a plurality of integrated circuits. It will be recognized by one skilled in the art, that the present exemplary embodiments may be practiced without some or all of these specific details. In other instances, well-known operations have not been described in detail in order not to unnecessarily obscure the present embodiments.

Figure 1:
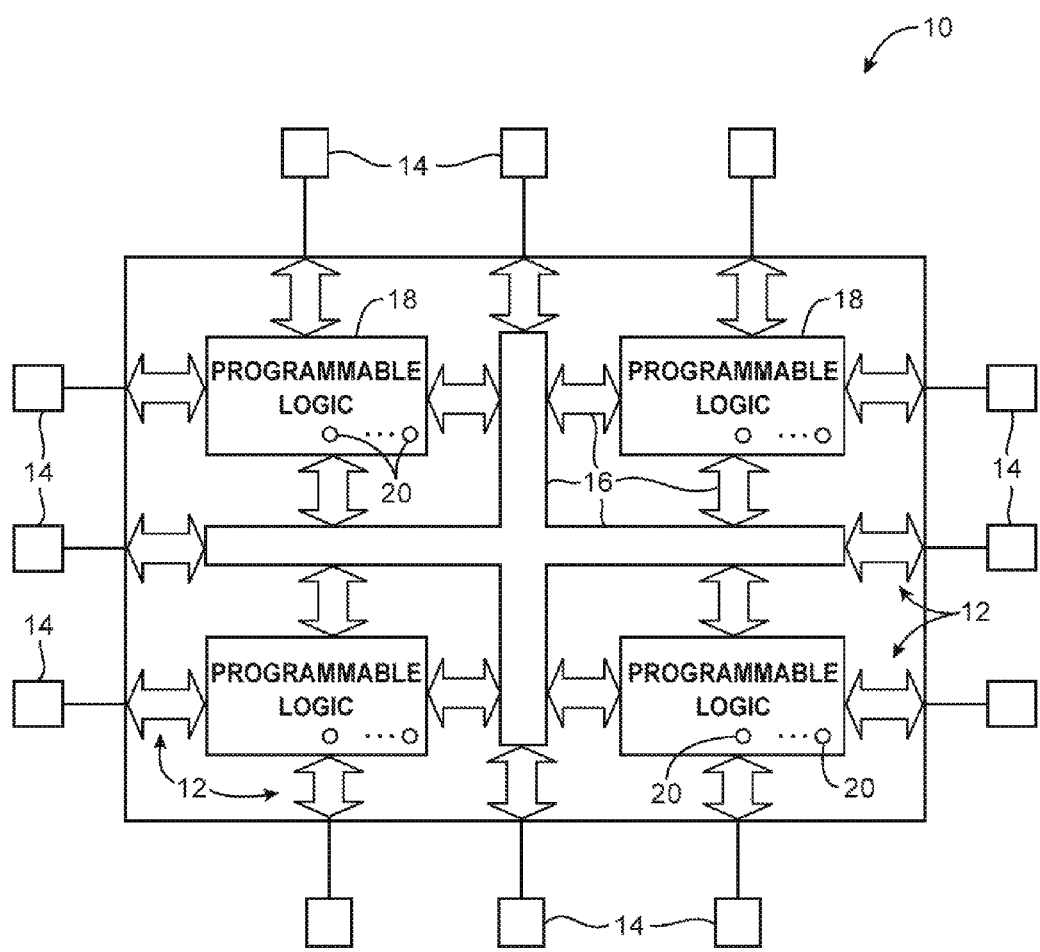
FIG. 1 is a diagram of an illustrative programmable integrated circuit in accordance with an embodiment of the present invention.

An illustrative integrated circuit of the type that may be provided with memory elements and associated circuits that can be controlled using output signals from the memory elements is shown in FIG. 1. As shown in FIG. 1, integrated circuit 10 may contain memory elements 20. Memory elements 20 may be loaded with configuration data to configure programmable transistors such as pass transistors (sometimes referred to as pass gates or pass gate transistors) in programmable circuitry such as programmable logic 18.

Because memory elements 20 may be used in storing configuration data for programmable logic 18, memory elements 20 may sometimes be referred to as configuration random-access memory (CRAM) cells. Integrated circuit 10 may be configured to implement custom logic functions by configuring programmable logic 18. As a result, integrated circuit 10 may sometimes be referred to as a programmable integrated circuit or a programmable logic device (PLD) integrated circuit.

As shown in FIG. 1, programmable integrated circuit 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 may include fixed interconnects (conductive lines) and programmable interconnects (i.e., programmable connections between respective fixed interconnects).

Programmable logic 18 may include combinational and sequential logic circuitry. Programmable logic 18 may be configured to perform a custom logic function. The programmable interconnects associated with interconnection resources 16 may be considered to form a part of programmable logic 18.

When memory elements 20 are loaded with configuration data, the memory elements each provide a corresponding static control output signal that controls the state of an associated logic component in programmable logic 18. The memory element output signals may, for example, be used to control the gates of metal-oxide-semiconductor (MOS) transistors such as n-channel metal-oxide-semiconductor (NMOS) pass transistors in programmable components such as multiplexers, logic gates such as AND gates, OR gates, XOR gates, NAND gates, NOR gates, etc. P-channel transistors (e.g., a p-channel metal-oxide-semiconductor pass transistor) may also be controlled by output signals from memory elements 20, if desired.

When a memory element output that is associated with an NMOS pass transistor is high, the pass transistor controlled by that memory element is turned on and passes logic signals from its input to its output. When the memory element output is low, an NMOS pass transistor is turned off and does not pass logic signals. P-channel metal-oxide-semiconductor (PMOS) pass transistors are turned on when the signal that is applied to its gate from the output of a memory element is low (e.g., 0 volts) and are turned off when the output of the memory element is high (i.e., the polarity for NMOS and PMOS control signals is reversed).

Configuration random-access memory elements 20 may be arranged in an array pattern. There may be, for example, millions of memory elements 20 on integrated circuit 10. During programming operations, the array of memory elements is provided with configuration data. Once loaded with configuration data, memory elements 20 may selectively control (e.g., turn on and off) portions of the circuitry in the programmable logic 18 and thereby customize the circuit functions of circuit 10.

The circuitry of programmable integrated circuit 10 may be organized using any suitable architecture. As an example, the circuitry of programmable integrated circuit 10 may be organized in a series of rows and columns of programmable logic blocks (regions) each of which contains multiple smaller logic regions. The logic resources of integrated circuit 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the circuitry of programmable integrated circuit 10 may be arranged in more levels or layers in which multiple large regions are interconnected to form still larger portions of logic. Still other device arrangements may use logic that is not arranged in rows and columns.

As integrated circuit fabrication technology scales towards smaller process nodes, it becomes increasingly challenging to design an entire system on a single integrated circuit die (sometimes referred to as a system-on-chip). Designing analog and digital circuitry to support desired performance levels while minimizing leakage and power consumption can be extremely time consuming and costly.

One alternative to single-die packages is an arrangement in which multiple dies are placed within a single package. Such types of packages that contain multiple interconnected dies may sometimes be referred to as systems-in-package (SiPs), multichip modules (MCM), or multichip packages. Placing multiple chips (dies) into a single package may allow each die to be implemented using the most appropriate technology process (e.g., a memory chip may be implemented using the 28 nm technology node, whereas the radio-frequency analog chip may be implemented using the 90 nm technology node), may increase the performance of die-to-die interface (e.g., driving signals from one die to another within a single package is substantially easier than driving signals from one package to another, thereby reducing power consumption of associated input-output buffers), may free up input-output pins (e.g., input-output pins associated with die-to-die connections are much smaller than pins associated with package-to-board connections), and may help simplify printed circuit board (PCB) design (i.e., the design of the PCB on which the multichip package is mounted during normal system operation).

Figure 2:
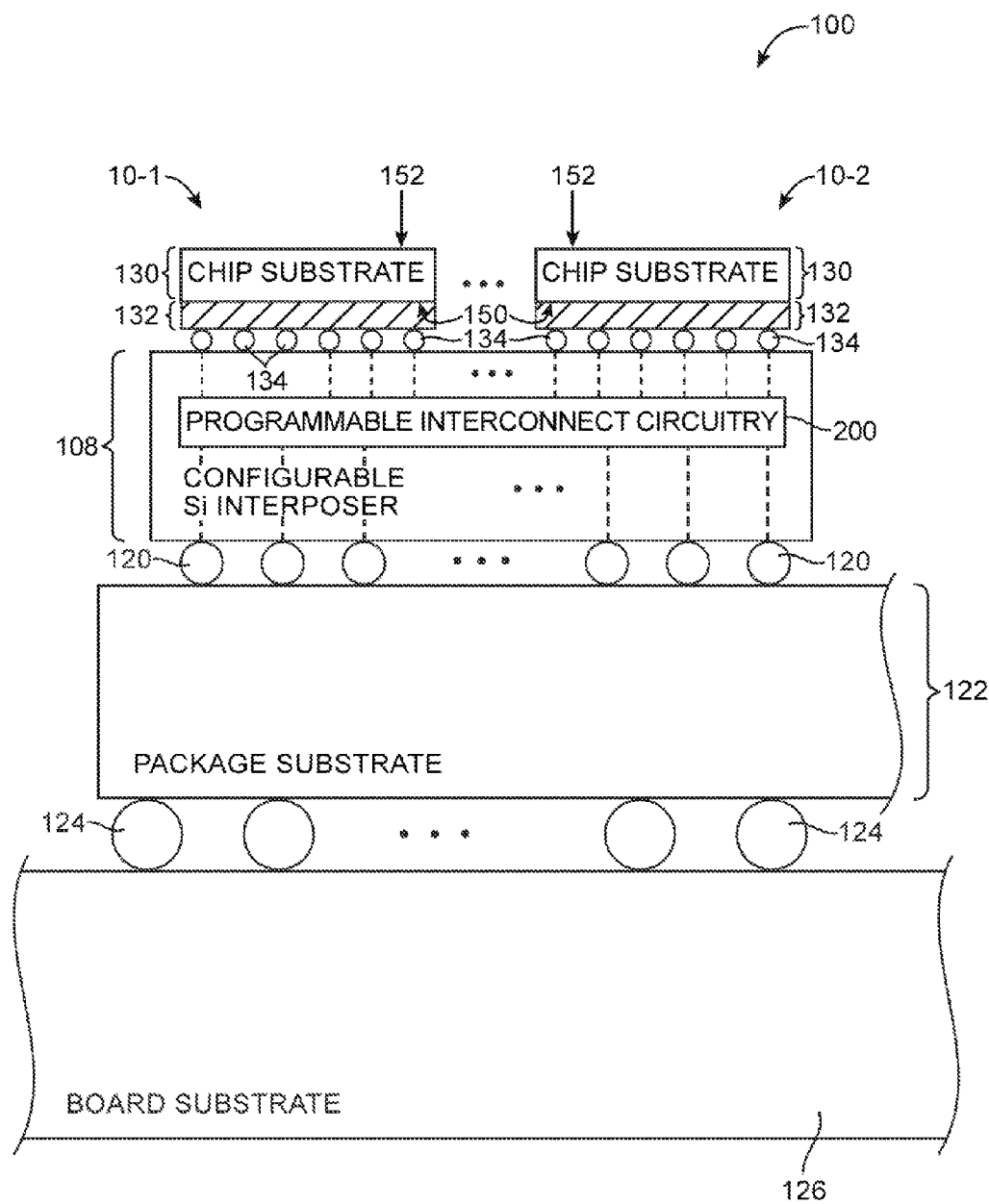
FIG. 2 is a cross-sectional side view of an illustrative multichip package having at least two dies that are arranged laterally on top of a programmable interposer in accordance with an embodiment of the present invention.

FIG. 2 is a cross-sectional side view of an illustrative multichip package 100. As shown in FIG. 2, multichip package 100 may include a package substrate such as package substrate 122, interposer 108 that is mounted on top of package substrate 122, and multiple dies mounted on top of interposer 108 (e.g., dies 10-1 and 10-2 may be mounted laterally with respect to each other on top of interposer 108).

Package substrate 122 may be coupled to board substrate 126 via solder balls 124. As an example, solder balls 124 may form a ball grid array (BGA) configuration for interfacing with corresponding conductive pads on substrate 126. Substrate 126 may be a printed circuit board (PCB) on which multichip package 100 and other single-chip or multichip packages may be mounted. The exemplary configuration of FIG. 2 in which two laterally positioned dies are interconnected via an interposer structure 108 may sometimes be referred to as 2.5-dimensional ("2.5D") stacking. If desired, more than two laterally (horizontally) positioned dies may be mounted on top of interposer structure 108. In other suitable arrangements, multiple dies may be stacked vertically on top of one another. In general, multichip package may include any number of dies stacked on top of one another and dies arranged laterally with respect to one another.

Each die 10 (i.e., dies 10-1 and 10-2) may include a semiconductor substrate 130 (e.g., a p-type silicon substrate) having a first surface 150, a second surface 152, and interconnect layers 132 formed on the first surface 150 of substrate 130. Device structures such as transistor gate structures, capacitor plate structures, resistive load structures, density-compliance structures, and other device structures may be formed at the interface where interconnect layers 132 meet surface 150.

Interconnect layers 132 (sometimes referred to collectively as a dielectric stack) may include alternating layers of metal routing layers (e.g., dielectric layers in which metal routing paths can be formed) and via layers (e.g., dielectric layers through which metal vias can be formed for electrically connecting paths from one metal routing layer to paths in another metal routing layer).

Surface 150 on which interconnect layers 132 are formed is typically referred to as the "upper" surface of substrate 130. The configuration as shown in FIG. 2 in which surface 150 is facing downwards towards package substrate 122 is therefore sometimes referred to as a flip-chip configuration, because each die 10 is inverted/flipped from its upright orientation.

Dies 10-1 and 10-2 may be coupled to interposer 108 via microbumps 134. Microbumps 134 may refer to solder bumps that are formed on the uppermost layer of interconnect stack 132 and may each have a diameter of 10 μm (as an example). In particular, microbumps 134 may be deposited on microbump pads that are formed in the uppermost layer of interconnect stack 132.

Interposer 108 may be coupled to package substrate 122 via bumps 120. Bumps 120 that interface directly with package substrate 122 may sometimes be referred to as controlled collapse chip connection (C4) bumps or "flip-chip" bumps and may each have a diameter of 100 μm (as an example). Generally, flip-chip bumps 120 (e.g., bumps used for interfacing with off-package components) are substantially larger in size compared to microbumps 134 (e.g., bumps used for interfacing with other dies within the same package). The number of microbumps 134 is typically much greater than the number of flip-chip bumps 120 (e.g., the ratio of the number of microbumps to the number of flip-chip bumps may be greater than 2:1, 5:1, 10:1, etc.).

As shown in FIG. 2, interposer 108 may include programmable interconnect circuitry 200 that is used to form routing connections to each die 10 that is mounted on top of interposer 108 via microbumps 134 and to form routing connections to other devices on package substrate 122 or board substrate 126 via flip-chip bumps 120. Programmable interconnect circuitry 200 may include fixed and/or configurable interconnection resources such as global and local vertical and horizontal conductive lines and buses for routing signals through interposer 108. The global conductive lines may span substantially all of interposer 108, whereas the local conductive lines may span only part of interposer 108.

In one suitable arrangement, interposer 108 may be formed from silicon (e.g., interconnect circuitry 200 may be formed in a silicon substrate). Silicon interposer 108 may include programmable resources such as the programmable circuitry that is included in programmable integrated circuit 10 of the type described in connection with FIG. 1, except interposer 108 need not include any combinational or sequential logic (e.g., interposer 108 need not include circuitry for performing user-defined logic functions). Interposer 108 of this type may include circuitry such as circuitry 200 that is primarily used for providing desired routing connections for dies 10 within multichip package 100. If desired, however, interposer 108 may contain some logic for implementing interface functionality for facilitating communications between different dies in package 100 and for performing other desired functions for the on-interposer devices. Offloading some of these functions from the on-interposer devices to interposer-embedded logic can help reduce processing requirements for the on-interposer devices.

Interposer 108 formed and operated in this way may sometimes be referred to as a configurable silicon interposer integrated circuit, a programmable interposer PCB on a chip, a programmable interposer card, a programmable "fabric" interposer, an "active" programmable interposer (e.g., an interposer that contains embedded logic for facilitating desired operations for dies within package 100), etc. In general, any type of bare-die integrated circuit 10 may be mounted on top of interposer 108, including but not limited to devices such as microprocessors (or CPUs), digital signal processors (DSPs), application specific standard products (ASSPs), application specific integrated circuits (ASICs), static random-access memory (SRAM) chips, dynamic random-access memory (DRAM) chips, read-only memory (ROM) chips, programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), just to name a few.

Figure 3:
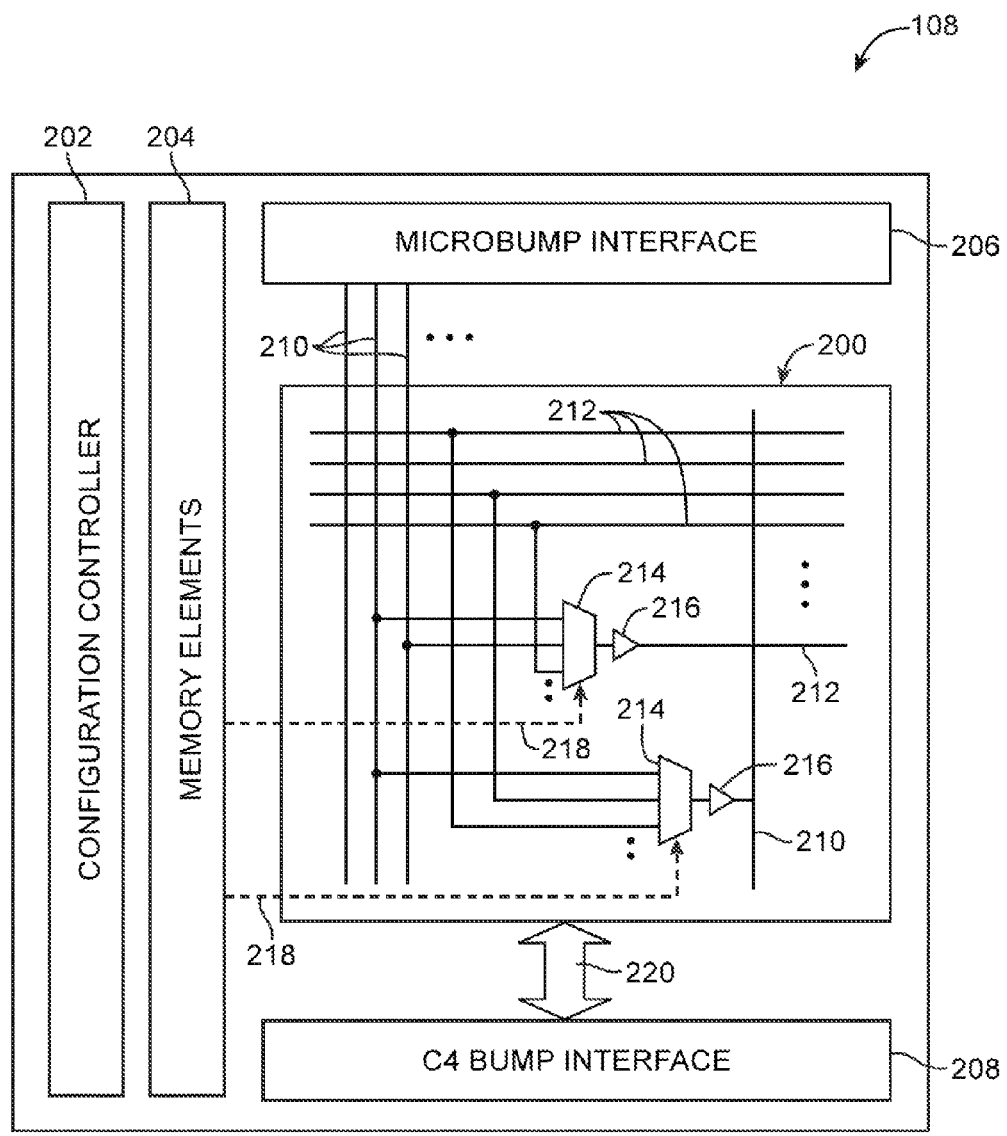
FIG. 3 is a diagram of an illustrative programmable interposer integrated circuit in accordance with an embodiment of the present invention.

FIG. 3 shows a more detailed diagram of configurable interposer 108. As shown in FIG. 3, interposer 108 may include, in addition to programmable interconnect circuitry 200, a configuration controller 202, memory elements 204, microbump interface circuitry 206, and flip-chip bump interface circuitry 208. In the example of FIG. 3, programmable interconnect circuitry 200 includes a collection of horizontal and vertical wires that are connected by programmable fabric such as routing multiplexing circuits (e.g., multiplexers) 214. In general, interposer 108 may include hundreds, thousands, or millions of multiplexers 216 that can be configured to provide any suitable routing arrangement. Each routing multiplexer 214 may have inputs some of which receive signals from various vertical wires 210 and some of which receive signals from various horizontal wires 212, a control input, and an output on which a corresponding signal may be routed from one of its inputs.

Horizontal interconnects 212 and vertical interconnects 210 may be formed with varying lengths depending on the distance that each conductor spans. Each multiplexer 214 may be coupled to an associated driver circuit 216 that is used for driving the output signal onto a corresponding horizontal conductor 212 or vertical conductor 210. Driver 216 may drive signals onto the interconnects with an appropriate drive strength based on the lengths of the interconnects and/or other physical characteristics of the interconnects. For example, a first driver 216 may drive a first interconnect conductor with a higher drive strength than a second driver 216 that drives a second interconnect conductor, because the first interconnect conductor has a greater resistance than the second interconnect conductor (e.g., because the first interconnect conductor spans a longer distance than the second interconnect conductor). However, it is appreciated that the drive strength may similarly vary based on the width of the interconnection as well.

Each routing multiplexer 214 may receive at its control input a respective set of configuration data bits for configuring that multiplexer 214 to route signals from a selected one of its inputs to its output. The configuration data bits may be provided from memory elements 204 over paths 218. Configuration controller 202 may be used to load the desired pattern of configuration data bits (sometimes referred to as a programming bitstream) into memory elements 204 to configure interconnect circuitry 200 with the desired routing arrangements. Configuration controller 202 may be implemented as a data register, a shift register, a state machine, or other types of circuitry that is suitable for loading the programming bitstream into memory elements 204.

Circuitry 206 may serve as an interface between dies 10 that are mounted on top of interposer 108 (sometimes referred to as "on-interposer" dies) and programmable interconnect circuitry 200, whereas circuitry 208 may serve as an interface between interconnect circuitry 200 and package substrate 122. In general, programmable interconnect circuitry 200 may route signals via microbump interface 206 and flip-chip bump interface 208 in either direction (as indicated by path 220).

As an example, a signal that is received by interconnect circuitry 200 via interface 206 may be selectively routed to a corresponding flip-chip bump 120 via interface 208. As another example, a signal from a given die 10 that is received by interconnect circuitry 200 via interface 206 may be routed back through interface 206 to the given die 10 or another die that is mounted on interposer 108. As yet another example, a signal that is received by interconnect circuitry 200 via interface 208 may be selectively routed to a corresponding microbump 134 via interface 206. Other types of connectivity may also be provided by programming configurable interposer 108 with the desired settings. If desired, any portion of drivers 216 may be placed in tristate mode when an input-output path need not be actively driven.

Figure 4:
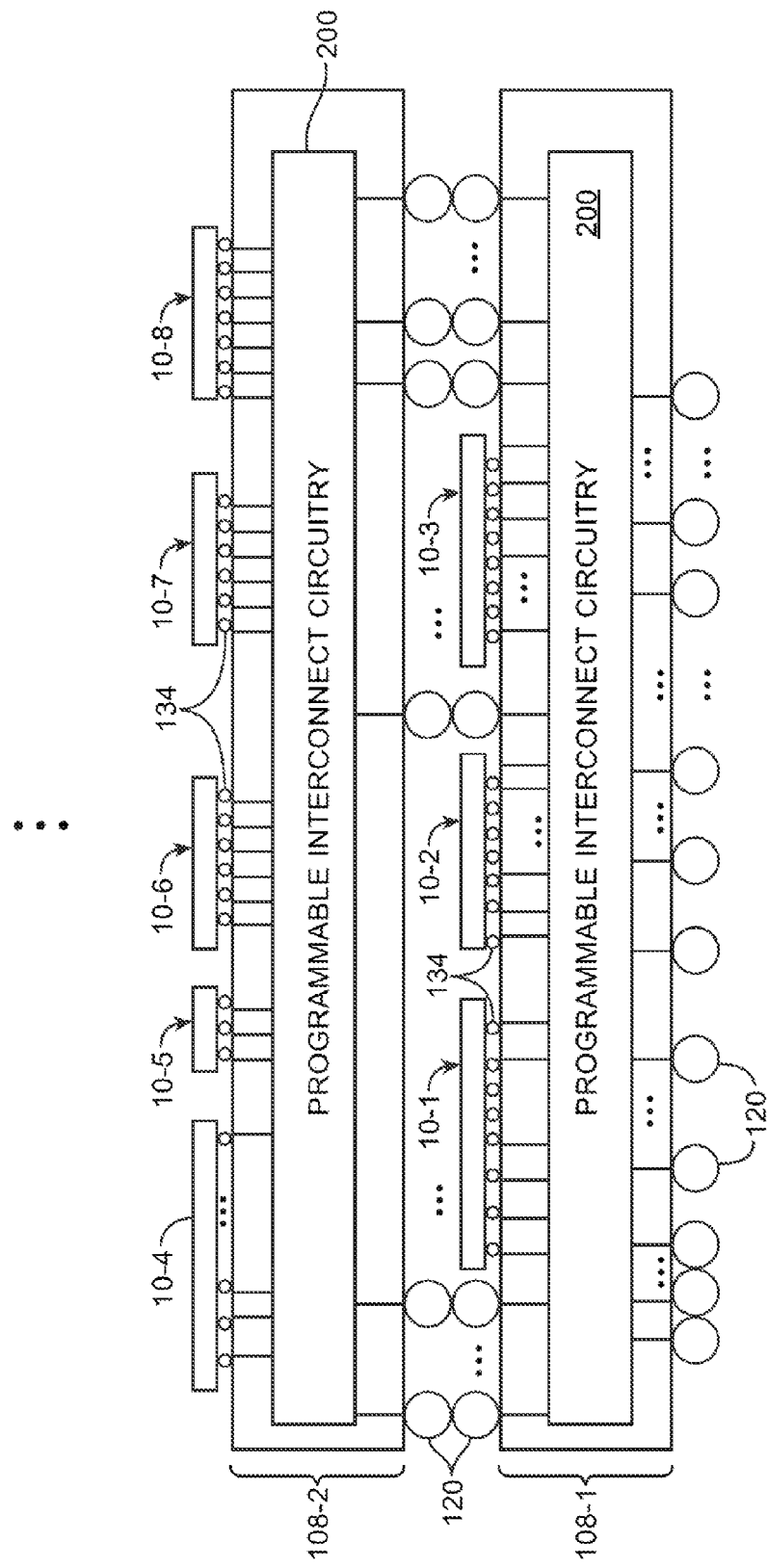
FIG. 4 is a cross-sectional side view of an illustrative multichip package that includes multiple programmable interposers stacked vertically with respect one another in accordance with an embodiment of the present invention.

In another suitable embodiment of the present invention, multiple interposers 108 may be stacked vertically on top of one another (see, e.g., FIG. 4). As shown in FIG. 4, interposer 108-2 may be stacked on top of interposer 108-1. In one embodiment, programmable interconnect circuitry 200 of interposer 108-1 may be selectively coupled to programmable interconnect circuitry 200 of interposer 108-2 via flip-chip (C4) bumps 120 that are interposed between interposers 108-1 and 108-2.

Integrated circuit dies may be mounted on top of each interposer 108-1 and 108-2. In the example of FIG. 4, dies 10-1, 10-2, and 10-2 may be mounted on top of interposer 108-1, whereas dies 10-4, 10-5, 10-6, 10-7, and 10-8 may be mounted on top of interposer 108-2. This type of configuration in which interposers are stacked vertically on top of one another may sometimes be referred to as "3D" stacking. In some scenarios, through-silicon vias (TSVs) may be formed through the silicon substrate of each interposer 108 in a 3D stack for allowing vertical connectivity. In certain embodiments, such TSVs can be used to provide connections between programmable interconnect circuitry located on two separate programmable interposers or between dies that are mounted on two separate programmable interposers. Such 3D stacking enables interconnectivity among dies that are mounted on separate programmable interposers, thereby facilitating the physical expansion of a system design.

The multichip package arrangements as shown in FIGS. 2 and 4 are merely illustrative and do not serve to limit the scope of the present invention. If desired, multichip package 100 may include any number of dies that are interconnected using one or more configurable interposers 108. In general, dies that are part of a multichip package 100 may be contained within a housing that is molded from plastic, resin, ceramic, or other suitable materials.

Figure 5:
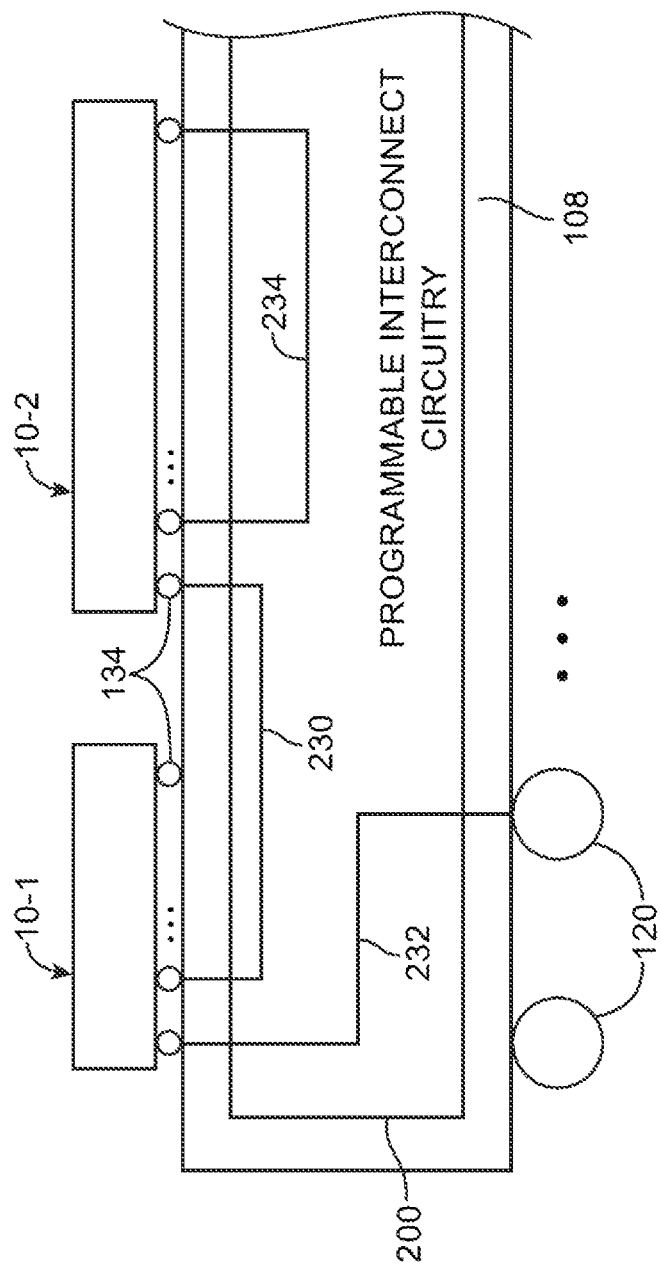
FIG. 5 is a cross-sectional side view of a programmable interposer illustrating different types of routing connections that can be made in the programmable interposer in accordance with an embodiment of the present invention.

FIG. 5 is a cross-sectional side view of interposer 108 showing some of the different possible routing connections that can be made using programmable interconnect fabric 200. As shown in FIG. 5, programmable interconnect circuitry 200 may be used for routing signals between different dies that are mounted on an interposer 108 (e.g., die 10-1 may be coupled to die 10-2 via inter-die routing path 230). Programmable interconnect circuitry 200 may also be used for routing signals from one or more off-interposer devices (e.g., die 10-1 may be coupled to one or more existing vertically-stacked die and/or to one or more existing off-interposer devices via path 232 and flip-chip bump 120). This flexibility in routing input-output pins of each die 10 to user-preferred flip-chip bumps 120 enables a system designer to select a preferred signal input-output placement which is optimized for the target PCB design on which the base interposer 108 is mounted. Such types of paths may also be used in sharing clock signals, reset signals, address signals, and other control signals among multiple different devices formed within multichip package 100.

In some embodiments, programmable interconnect circuitry 200 may also be used for routing long-distance signals for an individual die. There may, for example, be tens of thousands of microbumps 134 formed at the interface between die 10-2 and interposer 108. In most scenarios, only a portion of the microbumps 134 associated with a given die is used in forming connections with other on-interposer dies and off-interposer devices. The remaining portion of microbumps 134 may therefore be used to provide additional routing resources for that die (see, e.g., path 234 in FIG. 5). Performing "self-routing" in this way can help to reduce the complexity of routing resources that is required within the given die, thereby reducing cost.

In conventional single-chip packages, an integrated circuit is connected directly to the package substrate via flip-chip bumps. The number of flip-chip bumps interposed between the integrated circuit and the package substrate is typically on the order of a thousand. In multichip packages, however, the use of microbumps 134 between on-interposer dies and interposer 108 dramatically increases the number of interconnections that can be made. The number of microbumps 134 that can be formed between an integrated circuit and interposer 108 may be on the order of tens of thousands. This wide availability of input-output connections via microbumps may allow integrated circuits to perform some of its routing off-chip on the interposer. The self-routing technique described in connection with FIG. 5 is one example of how routing may be performed off-chip.

Figure 6:
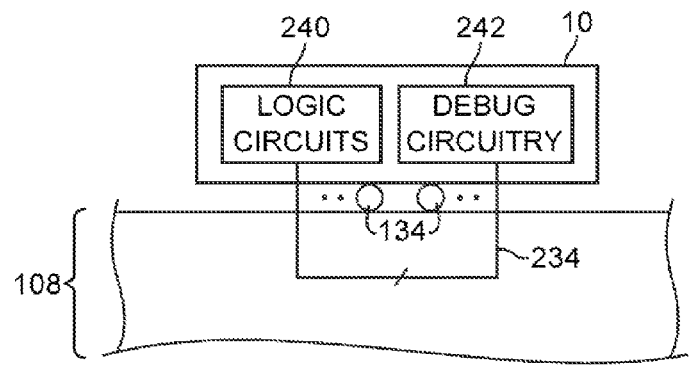
FIG. 6 is a diagram showing how a programmable interposer may be used to provide additional routing for an integrated circuit for debugging purposes in accordance with an embodiment of the present invention.

In another suitable arrangement of the present invention, user signals may be routed off-chip for debugging purposes. FIG. 6 illustrates an example in which user signals that are generated by logic circuits 240 in device 10 may be routed to debugging circuitry 242 that is also formed in device 10. The user/test signals may be conveyed from circuits 240 to debug circuitry 242 via programmable self-route path 234 in interposer 108. The programmable interconnect circuitry in interposer 108 used in this way may therefore serve as wide-bandwidth user debug pins.

Figure 7A:
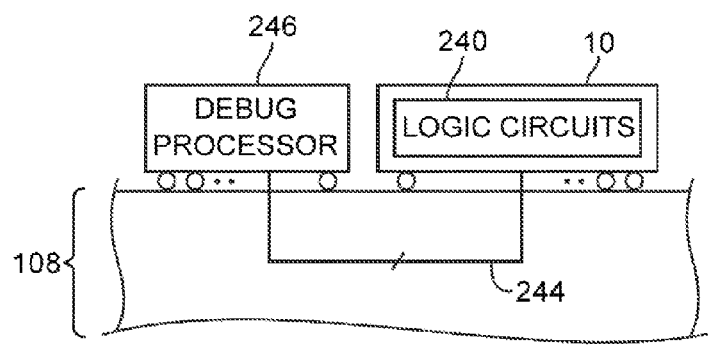
FIG. 7A is a diagram showing how an integrated circuit may be routed to a separate debug processor both of which are mounted on a programmable interposer in accordance with an embodiment of the present invention.

FIG. 7A shows another suitable debugging configuration in which signals under test may be routed from logic circuits 240 on device 10 to a separate debug processor 246. As shown in FIG. 7A, both device 10 and debug processor 246 are mounted on interposer 108. The user signals under test may be conveyed from circuits 240 to processor 246 via programmable die-to-die routing path 244.

Figure 7B:
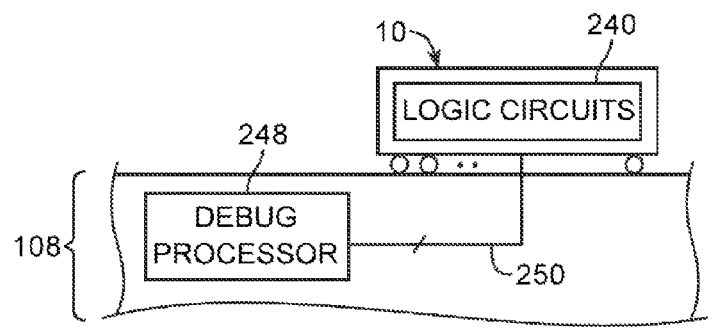
FIG. 7B is a diagram showing how an integrated circuit that is mounted on a programmable interposer may be routed to a debug processor that is embedded in the programmable interposer in accordance with an embodiment of the present invention.

FIG. 7B shows another suitable debugging configuration in which user signals under test may be routed from logic circuits 240 on device 10 to a debug processor 248 that is embedded within interposer 108. In particular, debug processor 248 may be formed in the silicon substrate of interposer 108 (e.g., debug logic circuitry 248 may be formed as an integral part of configurable interposer 108). The user signals under test may be conveyed from circuits 240 to processor 248 via programmable routing path 250.

Figure 7C:
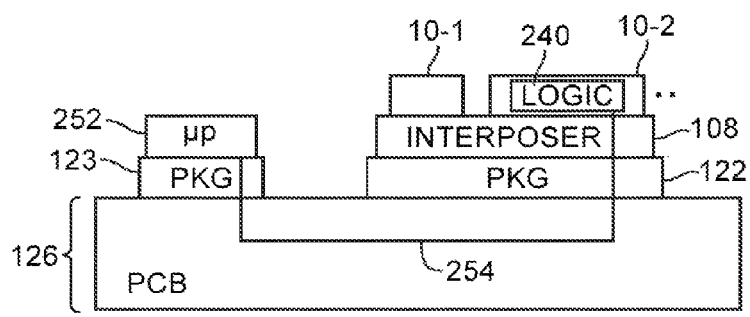
FIG. 7C is a diagram showing how an integrated circuit that is mounted on a programmable interposer may be routed to a off-interposer PCB-resident debug processor in accordance with an embodiment of the present invention.

FIG. 7C shows another suitable debugging configuration in which user signals under test may be routed from logic circuits 240 on device 10 to an off-interposer PCB-resident debug microprocessor 252. As shown in FIG. 7C, debug microprocessor 252 and die 10-2 in which logic circuits 240 are formed may be formed on separate packages that are both mounted on PCB 126 (e.g., die 10-2 may be mounted on a first package substrate 122, whereas debug processor 252 may be mounted on a second package substrate 123). The user signals may be conveyed from circuits 240 to processor 252 via path 254. At least a portion of path 254 that traverses interposer 108 may be programmable.

Figure 8:
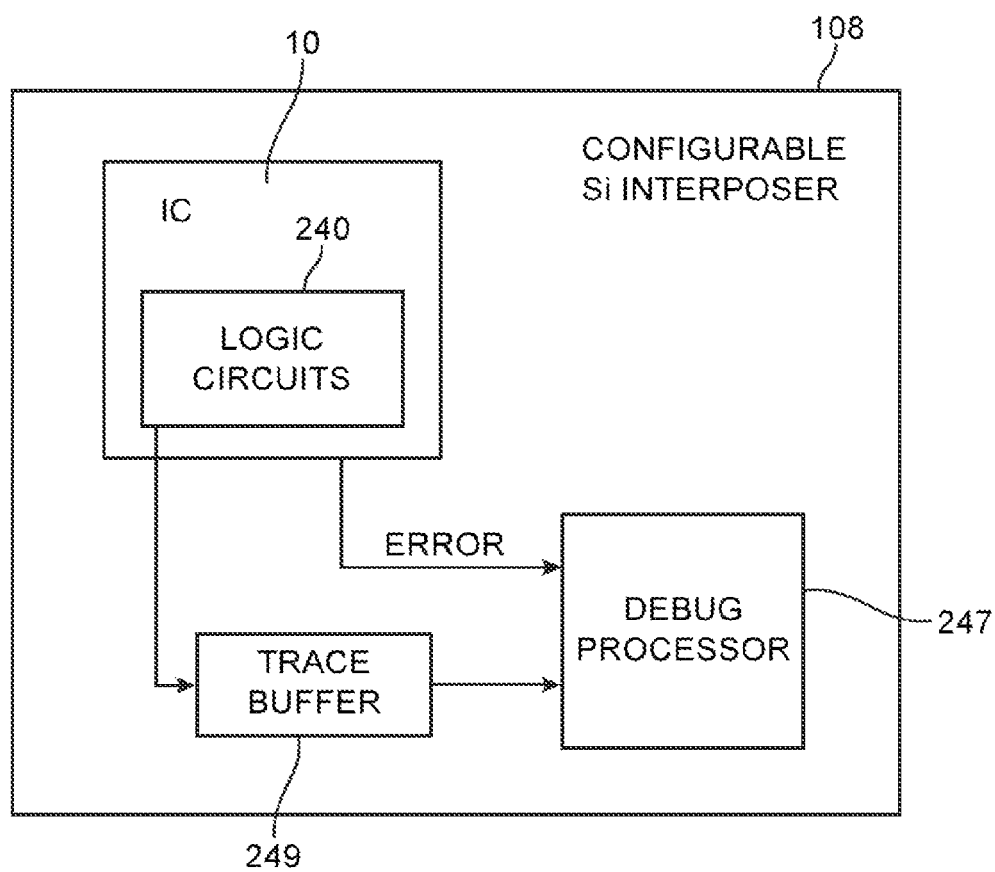
FIG. 8 is a diagram showing how an integrated circuit that is mounted on a programmable interposer may be routed to a trace buffer for check pointing in accordance with an embodiment of the present invention.

FIG. 8 is a top view of another suitable debugging configuration in which user/data signals may be routed from logic circuits 240 on device 10 to a separate debug processor 247 via a buffer circuit such as trace buffer 249. In the example of FIG. 8, debug processor 247 may be another die that is mounted on top of interposer 108 (as described in connection with FIG. 7A) or may be embedded in interposer 108 (as described in connection with FIG. 7B). Trace buffer circuit 249 may serve as a first-in first-out (FIFO) circuit for temporarily storing user signals that are output from logic circuit 240. When an error occurs on device 10, device 10 may provide an asserted control signal ERROR to debug processor 247. In response to detecting signal ERROR being asserted, debug processor 247 may retrieve the contents of trace buffer 249 to perform the necessary debugging operations. Performing debugging using this method may allow processor 247 to perform other system operations when signal ERROR is deasserted.

Figure 9:
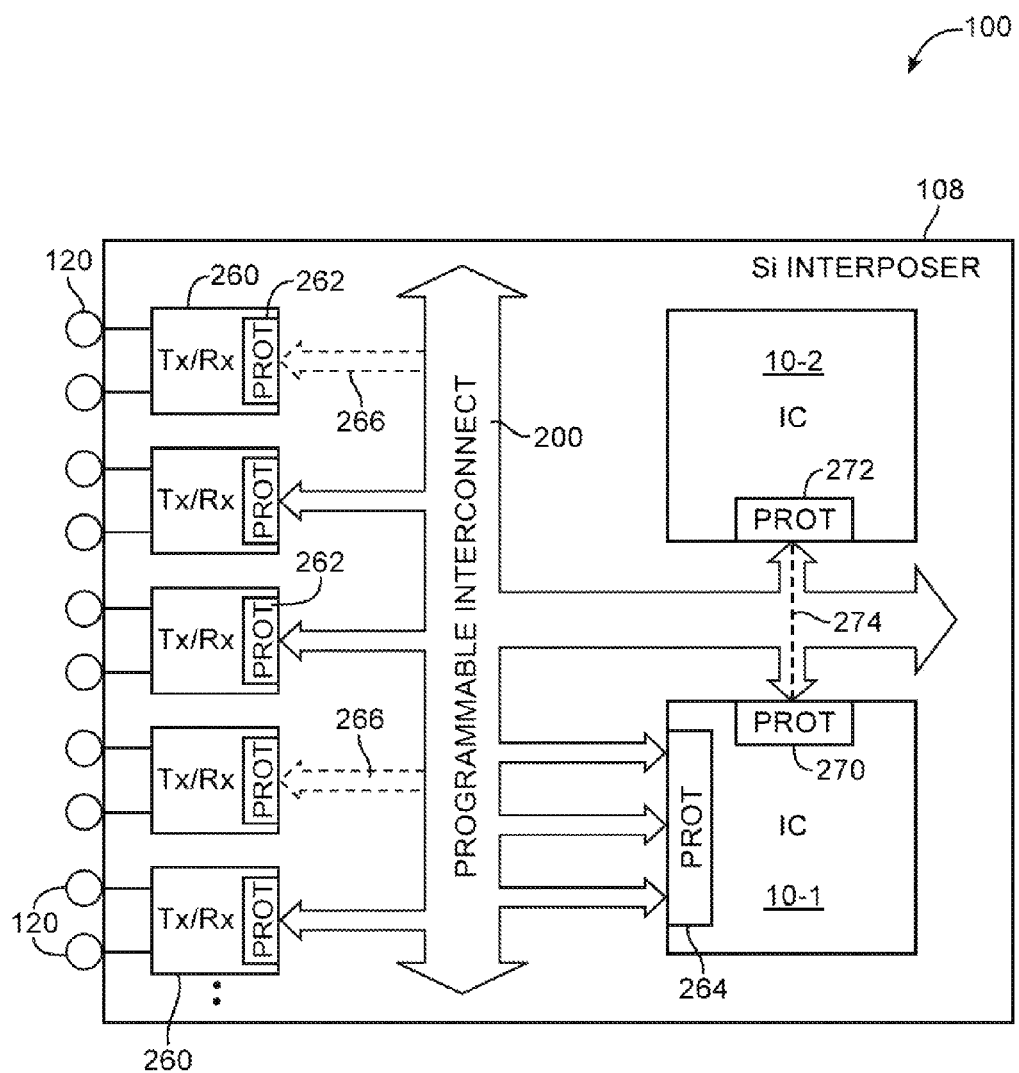
FIG. 9 is a diagram illustrating how integrated circuits on a programmable interposer may be routed to different types of communications devices that implement different communications protocols in accordance with an embodiment of the present invention.

In another suitable embodiment of the present invention, configurable silicon interposer 108 may also be used in packet processing applications to facilitate communications based on select interconnect protocols. FIG. 9 is a diagram illustrating a scenario in which multichip package 100 is being used as a line card (e.g., a device that is used to interface with a telecommunications access network such as the Internet or a local area network).

As shown in FIG. 9, multichip package 100 may include a first integrated circuit die 10-1, a second integrated circuit die 10-2, and multiple communications devices 260 mounted on configurable silicon interposer 108. Dies 10-1 and 10-2 may be any suitable type of integrated circuits. Die 10-1 may contain an input-output (I/O) interface 270 that is configured to communicate with I/O interface 272 of die 10-2 via programmable interconnect fabric 200 (as indicated by path 274). Interface circuits 270 and 272 may be communications devices that implement the same communications protocol/standard. As an example, interface circuits 270 and 272 may both serve to implement the Peripheral Component Interconnect Express (PCIe) high-speed serial computer expansion bus standard.

Programmable interconnect fabric 200 on interposer 108 may be configured to couple at least one of integrated circuits 10 to a portion of communications devices 260. In the example of FIG. 9, die 10-1 may be selectively coupled to three of the five communications devices 260 via programmable interconnect 200. This is merely illustrative. Interposer 108 may be capable of interfacing on-interposer dies with more or less than five communications devices via interconnect circuitry 200.

Each communications device 260 may be a transceiver integrated circuit that is capable of transmitting signals to and receiving signals from off-interposer devices via flip-chip bumps 120. Each transceiver 260 may contain a communications interface circuit 262 that implements a desired communications protocol/standard. Transceiver 260 having interface 262 is sometimes referred to as a physical media interface device. Each interface circuit 262 may be configured to implement a selected one of the Ethernet protocol (e.g., the protocol for controlling the Media Access Control sublayer), the Interlaken interconnect protocol, the double data rate (DDR) memory data transfer protocol, the PCIe bus standard, and/or other suitable input-output communications protocols.

Multichip package 100 formed in this way may be used to provide redundant capabilities. In the example of FIG. 9, only three of the five interface devices are actively connected to packet processing chip 10-1. Chip 10-1 may include an interface circuit 264 that is used to implement desired protocols for communicating with interface circuits 262. In scenarios in which one of the three interface devices is faulty or defective, one of the remaining idle interface devices may be switched into use to replace the faulty interface device (e.g., by reprogramming interconnect circuitry 200, as indicated by dashed arrow 266). This application assumes that a portion of the interface devices are of the same type (e.g., a portion of the active and inactive interface devices should implement the same communications protocol in order to support redundancy).

In general, devices 260 may be communications devices of different types (i.e., the active and inactive interface devices may implement a variety of different communications protocols). Having different types of communications devices 260 allows multichip package 100 to support a variety of different technologies that are useful in targeting different domain-specific applications such as wireline applications, wireless applications, etc. If desired, communications devices 260 may themselves be reprogrammable to support a variety of possible network applications.

Figure 10A:
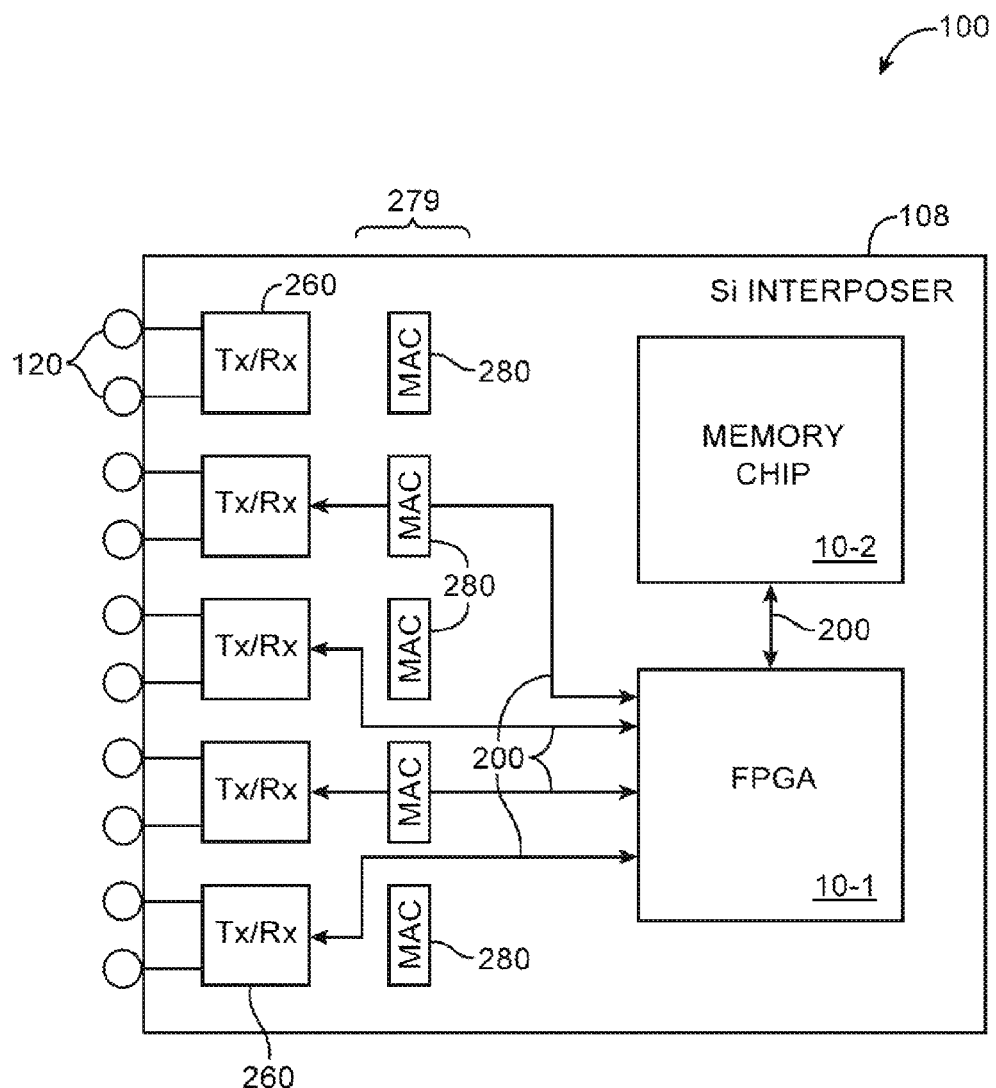
FIGS. 10A and 10B are diagrams illustrating a programmable interposer that includes embedded communications devices that implement different communications protocols in accordance with an embodiment of the present invention.

In certain domain-specific applications, it may be desirable to offload the protocol implementing interface circuits from transceiver integrated circuits 260 (see, e.g., FIG. 10A). The protocol implement interface circuits such as interface circuitry 280 of FIG. 10A may be embedded as non-reconfigurable or "hard" blocks (sometimes referred to as fixed-function blocks) in interposer 108. As shown in FIG. 10A, die 10-1 (e.g., a programmable integrated circuit such as an FPGA) may be coupled to die 10-2 (e.g., a memory chip contain SRAM cells) via programmable interposer interconnect 200 and may be coupled a selected portion of transceiver devices 260. In the example of FIG. 10A, two of the four transceiver devices 260 are coupled to die 10-1 via interposer-embedded media access controllers 280 (e.g., application specific interface circuits that are embedded in interposer 108 for supporting the Ethernet protocol) while another two of transceiver devices 260 are coupled to die 10-1 without being routed through the any media access controller 280. The different MAC blocks 280 may be selectively switched into using programmable interconnect paths 200.

The example of FIG. 10A in which multichip package 100 is use to target Ethernet specific applications is merely illustrative. If desired, interposer 108 may include different types of embedded communications protocol interface blocks for addressing different technologies and applications.

Figure 10B:
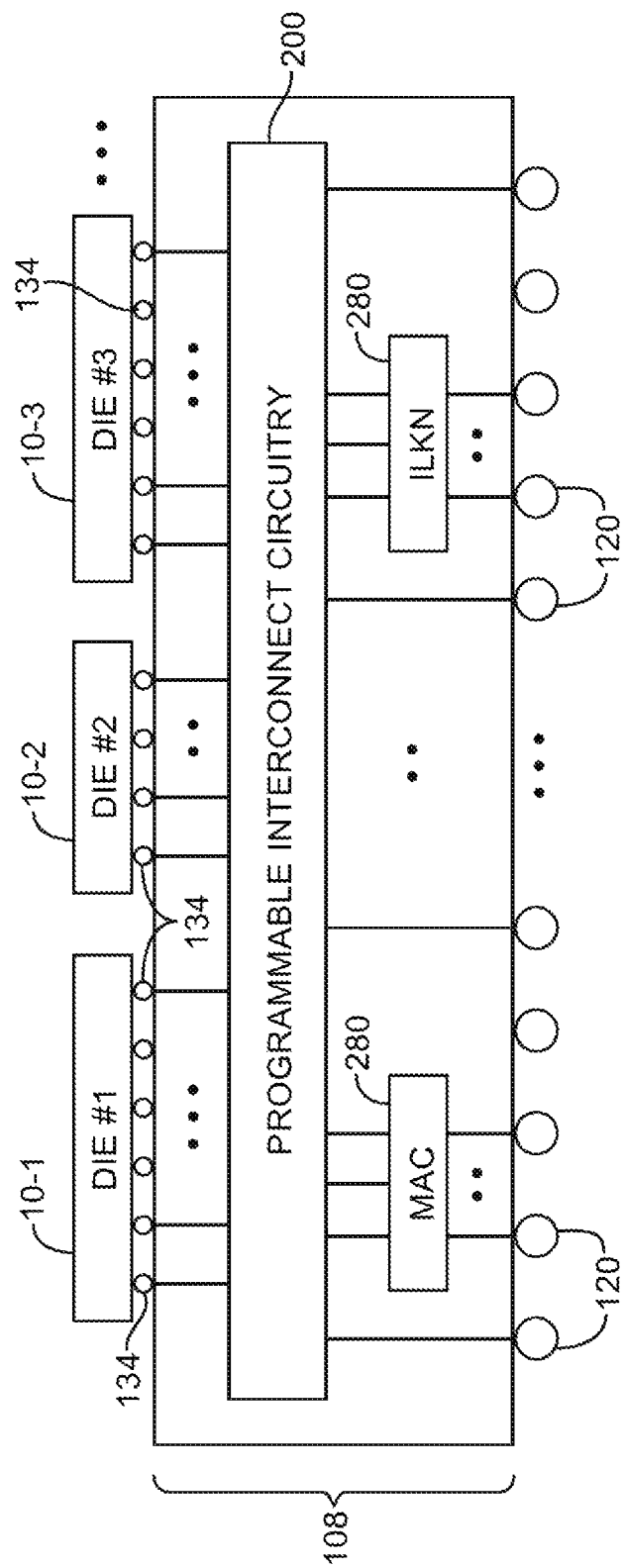

FIG. 10B is a cross-sectional side view of a multichip package 100 having an interposer 108 with different types of interposer-embedded communications protocol interface blocks 280 for addressing a wide variety of applications. In the example of FIG. 10B, three different types of integrated circuits dies 10-1, 10-2, and 10-3 may be mounted on interposer 108. Die 10-1 may be a programmable integrated circuit; die 10-2 may be a static random-access memory chip; and die 10-3 may be a synchronous dynamic random-access memory chip (as examples).

The different on-interposer dies 10 may be coupled to one another via programmable interposer interconnect circuitry 200 and may be coupled to bumps 120. Some of dies 10 may be coupled to bumps 120 via interposer embedded communications interface blocks 280. In the example of FIG. 10B, interposer 108 may include an embedded MAC block 280 for supporting the Ethernet protocol, an embedded ILKN block 280 for supporting the Interlaken interconnect protocol, and/or other interface blocks for handling other desired communications technologies.

Figure 11:
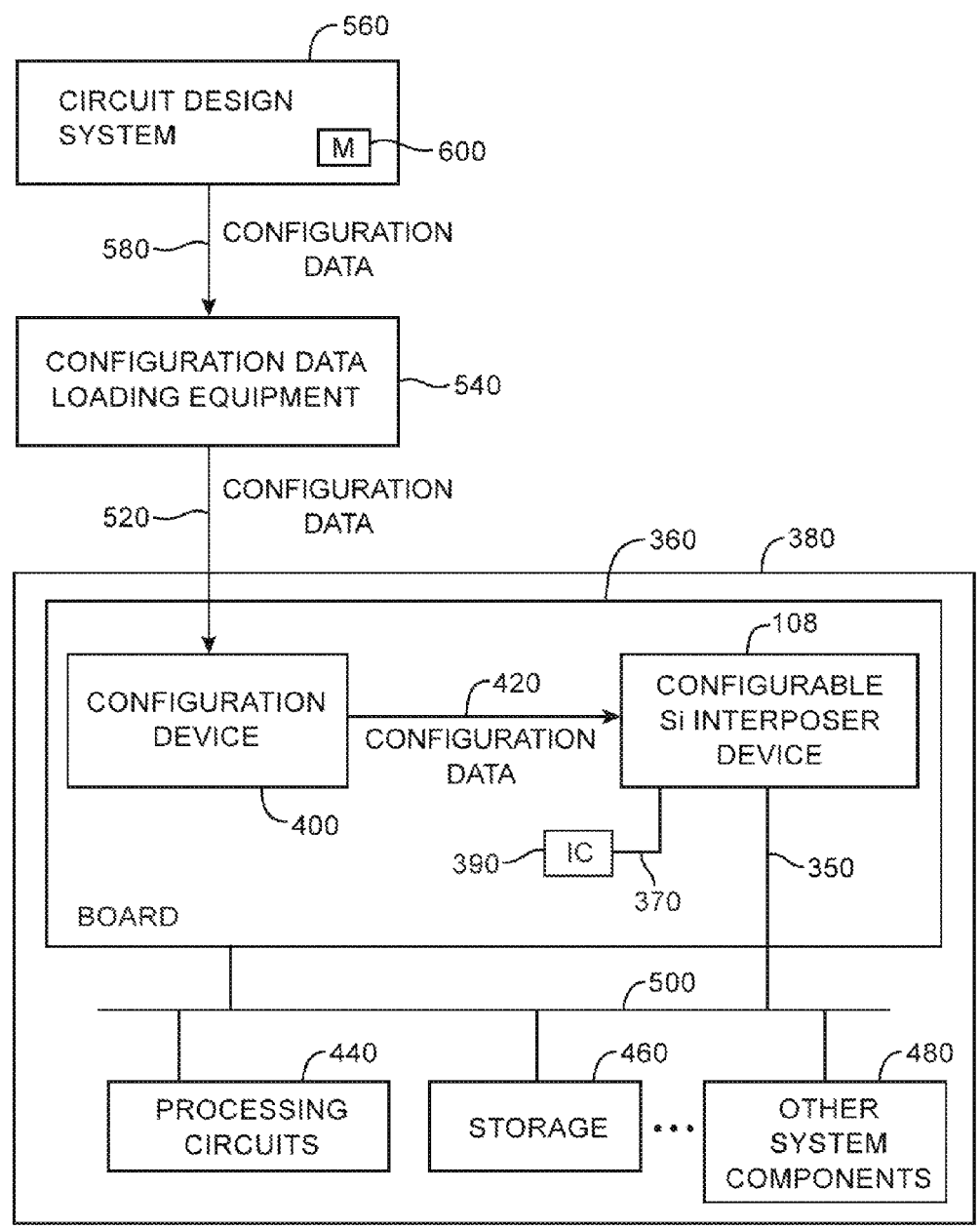
FIG. 11 is a diagram of an illustrative system environment in which a programmable interposer integrated circuit may be configured using a circuit design system in accordance with an embodiment of the present invention.

An illustrative system environment for designing and configuring a configurable interposer integrated circuit device 108 is shown in FIG. 11. During configuration operations, interposer 108 may be mounted on a board 360 in a system 380. Interposer 108 may receive configuration data from programming equipment or from any other suitable equipment or device.

In the example of FIG. 11, interposer 108 is a type of programmable integrated circuit that receives configuration data from an associated integrated circuit 400. With this type of arrangement, circuit 400 may, if desired, be mounted on the same board 360 as interposer 108. As an example, circuit 400 may be a programmable interconnect configuration data loading chip that interfaces with configuration controller 202 to load configuration data into interposer memory elements 204 (FIG. 3). The configuration data may be used to configure programmable interconnect circuitry 200 in a desired routing arrangement, to configure logic circuitry within interposer 108 to implement desired input-output communications protocols, to configure logic circuitry within interposer 108 to serve as debugging circuits, etc. When system 380 boots up (or at another suitable time), the configuration data may be supplied to interposer 108 from device 400, as shown schematically by path 420. The configuration data that is supplied to device 108 may be stored in its programmable memory elements 204 (e.g., configuration random-access-memory elements).

System 380 may include processing circuits 440, storage 460, and other system components 480 that communicate with device 108. The components of system 380 may be located on one or more boards such as board 360 or other suitable mounting structures or housings.

Communication paths may be used to interconnect device 108 to other components. For example, communication path 370 may be used to convey data between an integrated circuit 390 that is mounted on board 360 and device 108. Communication paths 350 and 500 can be used to convey signals between device 108 and components 440, 460, and 480.

Configuration device 400 may be supplied with the configuration data for device 108 over a path such as path 520. Configuration device 400 may, for example, receive the configuration data from configuration data loading equipment 540 or other suitable equipment that stores the configuration data in configuration device 400. Device 400 may be loaded with data before or after installation on board 360.

It can be a significant undertaking to design and implement desired routing configurations on an interposer that has to interface with various types of integrated circuits. Designers therefore generally use design systems based on computer-aided-design (CAD) tools to assist them in designing such types of circuits. A circuit design system can help a system designer design and test complex circuits for a system. When a design is complete, the design system may be used to generate configuration data for electrically programming the appropriate routing connections for interposer 108. The circuit design system may be implemented on computing equipment.

As shown in FIG. 11, the configuration data produced by a circuit design system 560 may be provided to equipment 540 over a path such as path 580. Equipment 540 provides the configuration data to device 400 so that device 400 can later provide this configuration data to device 108 over path 420.

System 560 may be based on one or more computers and one or more software programs. In general, software and data may be stored on any computer-readable medium (storage) in system 560 and is shown schematically as storage 600.

In a typical scenario, design system 560 is used by a circuit designer to create a custom routing design for interposer device 108. The system 560 produces corresponding configuration data which is provided to configuration device 400. Upon power-up, configuration device 400 and configuration controller 202 on device 108 is used to load the configuration data into the programmable memory elements 204 of device 108. Device 108 may then be used in normal operation to provide the desired routing connections in a multichip package.

Figure 12:
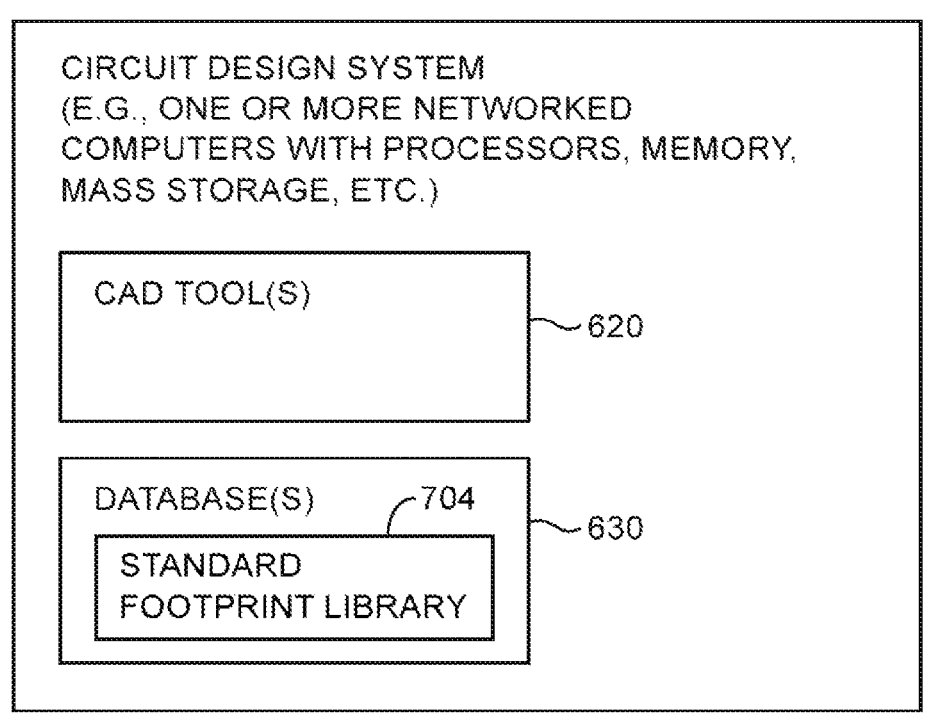
FIG. 12 is a diagram of a circuit design system for generating configuration data for implementing custom routing designs in programmable interposer integrated circuits in accordance with an embodiment of the present invention.

An illustrative circuit design system 560 in accordance with the present invention is shown in FIG. 12. System 560 may be based on one or more processors such as personal computers, workstations, etc. The processor(s) may be linked using a network (e.g., a local or wide area network). Memory in these computers or external memory and storage devices such as internal and/or external hard disks may be used to store instructions and data.

Software-based components such as computer-aided design tools 620 and databases 630 reside on system 560. During operation, executable software such as the software of computer aided design tools 620 runs on the processor(s) of system 560. Databases 630 are used to store data for the operation of system 560. In general, software and data may be stored on any computer-readable medium (storage) in system 560. Such storage, which is shown schematically as storage 600 of FIG. 11, may include computer memory chips, removable and fixed media such as hard disk drives, flash memory, compact discs (CDs), DVDs, other optical media, and floppy diskettes, tapes, or any other suitable memory or storage device(s). When the software of system 560 is installed, the storage 600 of system 560 has instructions and data that cause the computing equipment in system 560 to execute various methods (processes). When performing these processes, the computing equipment is configured to implement the functions of the logic design system.

The computer aided design (CAD) tools 620, some or all of which are sometimes referred to collectively as a CAD tool, may be provided by a single vendor or multiple vendors. Tools 620 may be provided as one or more suites of tools (e.g., a compiler suite for performing tasks associated with implementing a circuit design in a programmable logic device) and/or as one or more separate software components (tools). Database(s) 630 may include one or more databases that are accessed only by a particular tool or tools and may include one or more shared databases. Shared databases may be accessed by multiple tools. For example, a first tool may store data for a second tool in a shared database. The second tool can access the shared database to retrieve the data stored by the first tool. This allows one tool to pass information to another tool. Tools may also pass information between each other without storing information in a shared database if desired.

In one suitable embodiment of the present invention, database(s) 630 may include library of existing designs such as a standard footprint library 704. Library 704 may define a standard set of die footprints (i.e., a common set of interface formats). Such types of predetermined die footprints (sometimes referred to in the schematic representation as interface "pinout" templates) may refer to the location of different types of pins (e.g., power pins, ground pins, user pins, etc.).

Figure 16:
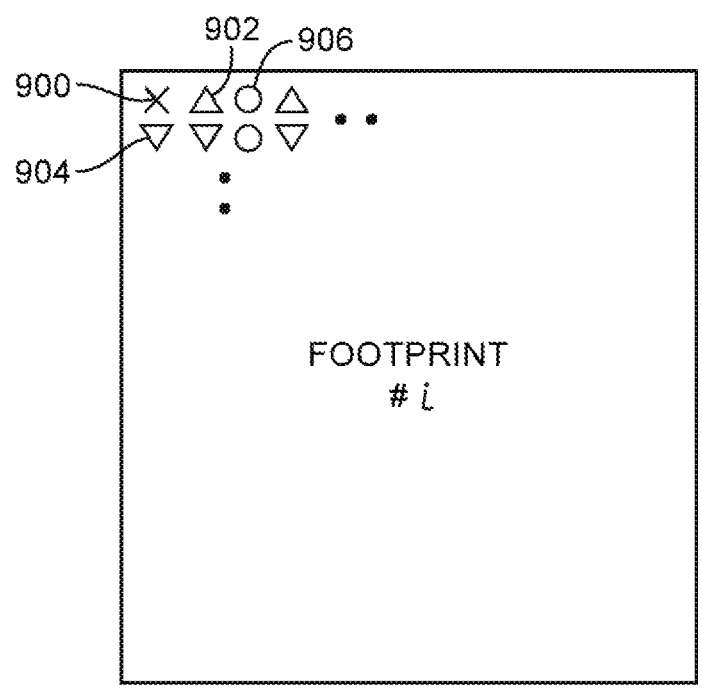
FIG. 16 is a diagram of an illustrative standardized pinout footprint in accordance with an embodiment of the present invention.

FIG. 16 shows an exemplary die footprint #i illustrating one suitable pinout arrangement. In the example of FIG. 16, locations marked as "X" represent idle microbump connection points; locations marked as "Δ" represent positive power supply microbump connection points; locations marked as "∇" represent ground power supply microbump connection points; whereas locations marked as "0" represent data/user signal microbump connections points.

The library of standard pinouts may be published so that integrated circuit dies 10 that are potentially designed by different manufacturers (i.e., dies 10 that are intended to be used in a multichip package with interposer 108) can conform to at least one of the published pinouts. Maintaining a library of predefined pinouts may allow for the generation of families of integrated circuits that are amenable to the same interposer 108 (e.g., so that families of die from one manufacturer or for one application can be combined with families of another). When designing an interposer in this way, a family of modular wireline processors with differing memory/buffer sizes can share the same floorplan format, different programmable integrated circuits can share the same floorplan format, different physical media interfaces (at least some of which are redundant) can share the same floorplan format, etc.

Figure 17:
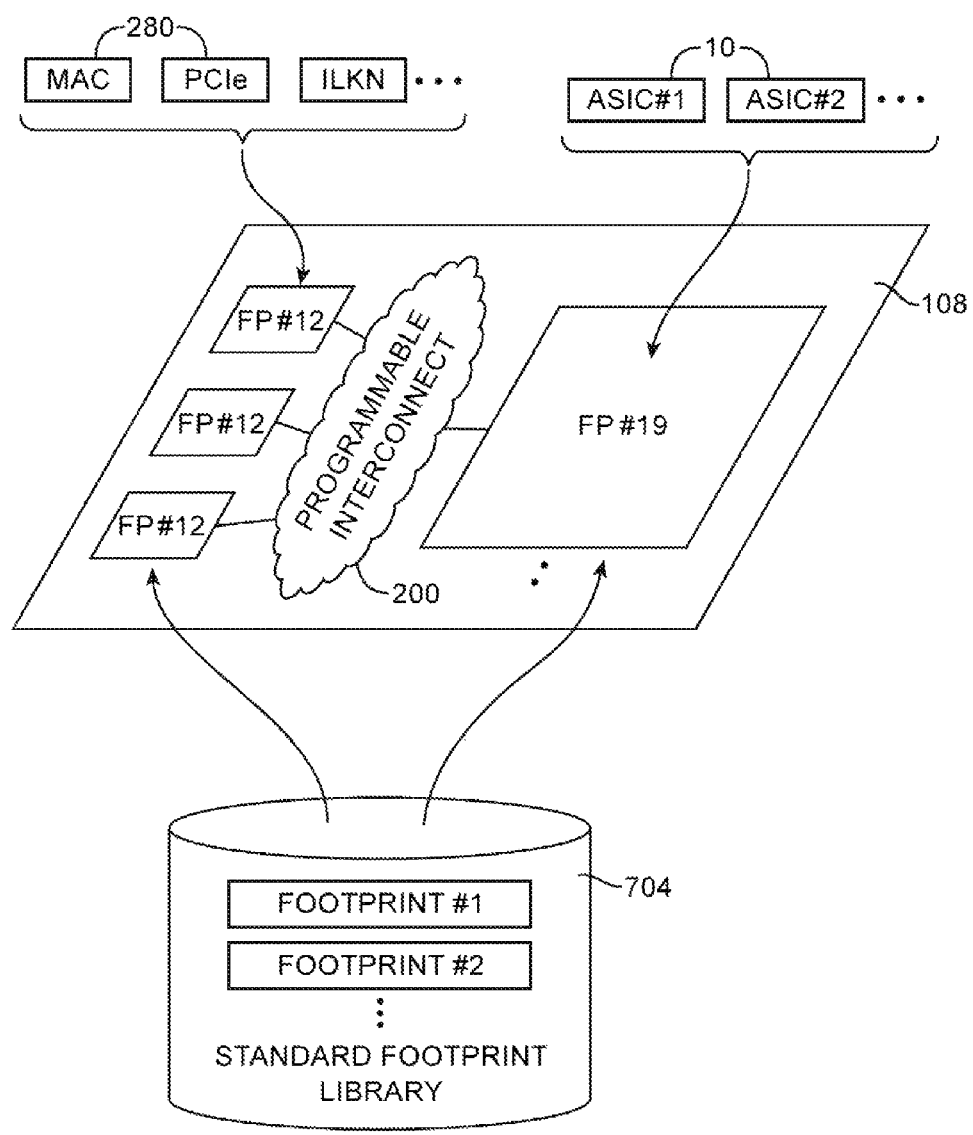
FIG. 17 is a diagram illustrating how standard footprints that are selected from a predefined library for use on a programmable interposer integrated circuit are capable of interfacing with corresponding families of devices in accordance with an embodiment of the present invention.

FIG. 17 illustrates an interposer 108 having a footprint #19 that is coupled to multiple footprints #12 via programmable interconnect circuitry 200. Footprints #19 and #12 may be selected from standard footprint library 704. In the example of FIG. 17, footprint #19 may represent a common pinout format that is capable of interfacing with a family of ASICs from a given manufacturer, whereas footprint #12 may represent a common pinout format that is capable of interfacing with a family of protocol implementing interface circuits 280.

As an example, microprocessors manufactured by Intel Corporation could share a common interface format in library 704. As another example, programmable integrated circuits manufactured by Altera Corporation may share another common interface format in library 704. As yet another example, network processing units (NPUs) manufactured by Broadcom Corporation, EZChip Semiconductor, and NETRONOME may share yet another common interface format in library 704. The use of standard footprint library 704 may simplify the design of multichip package systems by reducing the need for a new interposer device to be designed for every combination of die within a multichip package (e.g., the use of common interface formats can help facilitate the design of a multichip package when the multichip package includes chips from multiple manufacturers).

Figure 13:
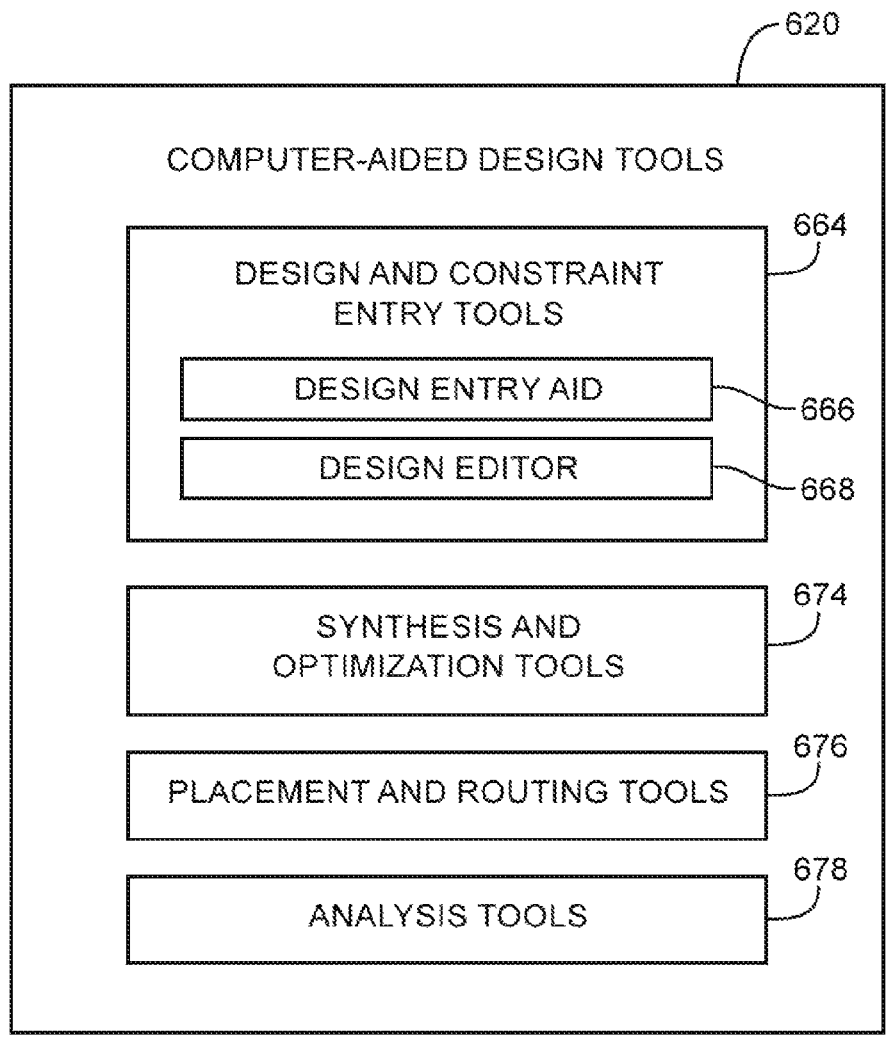
FIG. 13 is a diagram of illustrative computer-aided design (CAD) tools that may be used in a circuit design system in accordance with an embodiment of the present invention.

Illustrative computer aided design tools 620 that may be used in a logic design system such as system 560 of FIGS. 11 and 12 are shown in FIG. 13. The design process typically starts with the formulation of routing specifications. A circuit designer can specify the connections that interposer 108 needs to make using design and constraint entry tools 664. Design and constraint entry tools 664 may include tools such as design and constraint entry aid 666 and design editor 668. Design and constraint entry aids such as aid 666 may be used to help a circuit designer locate a desired design from a library of existing designs (e.g., from standard footprint library 704) and may provide computer-aided assistance to the circuit designer for entering (specifying) the desired design for interposer 108.

As an example, design and constraint entry aid 666 may be used to present screens of options for a user. The user may click on on-screen options to select whether the circuit being designed should have certain features. Design editor 668 may be used to enter a design (e.g., by entering lines of hardware description language code), may be used to edit a design obtained from a library (e.g., using a design and constraint entry aid), or may assist a user in selecting and editing appropriate prepackaged code/designs.

After the design has been entered using design and constraint entry tools 664, synthesis and optimization tools 674 may be used to implement the specified routing connections using the programmable interconnect circuitry 200 in interposer 108. Tools 674 may attempt to optimize the design by making appropriate selections of hardware to implement efficient allocation of routing resources based on user constraint data entered by the circuit designer using tools 664.

After circuit synthesis and optimization using tools 674, design system 560 may use tools such as placement and routing tools 676 to perform physical design steps (layout synthesis operations). Placement and routing tools 676 are used to determine how to physically realize the specified routing connections within the interposer device. Connections should be made to reduce interconnect delays or to satisfy timing requirements specifying the maximum permitted interconnect delay. The placement and routing tools 676 create orderly and efficient implementations of routing designs for a given interposer device.

Tools such as tools 674 and 676 may be part of a compiler suite (e.g., part of a suite of compiler tools provided by a configurable interposer device vendor). In accordance with the present invention, tools such as tools 674, 676, and 678 automatically take into account the effects of crosstalk between interconnects while implementing a desired circuit design. Tools 674, 676, and 678 may also include timing analysis tools. This allows tools 674 and 676 to satisfy performance requirements (e.g., timing requirements) when generating configuration data for programming integrated circuits such as programmable interposer integrated circuit 108.

After an implementation of the desired routing design for interposer 108 has been generated using placement and routing tools 676, the implementation of the design may be analyzed and tested using analysis tools 678. After satisfactory optimization operations have been completed using tools 620, tools 620 can produce the configuration data for the programmable logic device.

Figure 14:
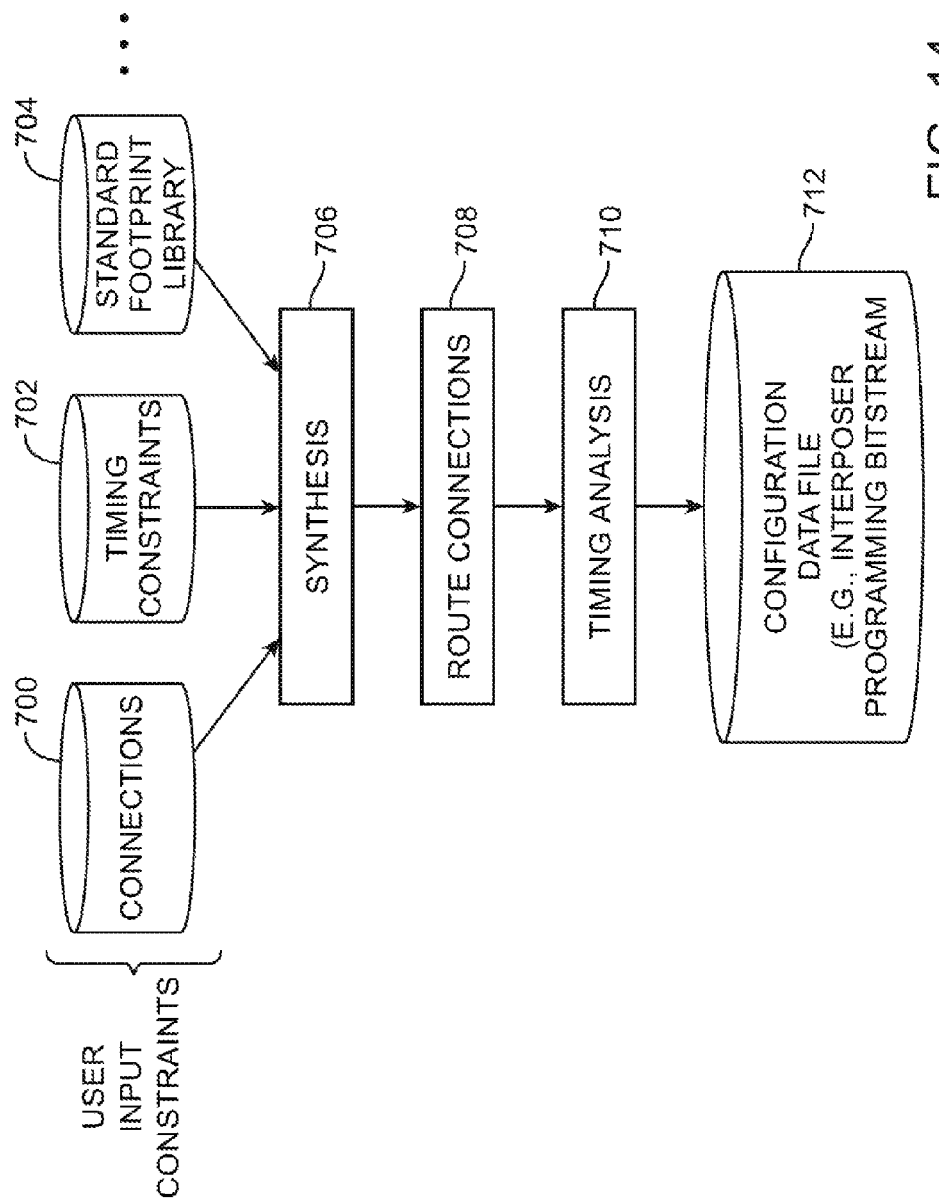
FIG. 14 is a flow chart of illustrative steps for designing a custom interposer integrated circuit and performing timing analysis in accordance with an embodiment of the present invention.

Illustrative operations involved in using tools 620 of FIG. 13 to produce configuration data files are shown in FIG. 14. At step 706, synthesis tools 674 may receive user input constraints such as a description of the desired routing connections 700, timing constraints 702 specifying the performance criteria for interposer 108, footprint designs selected from a standard footprint library 704, and other suitable input settings to produce a post-synthesis netlist.

At step 708, the post synthesis netlist is processed during place and route and optimization operations using tools 676. During the operations of step 708, the CAD tools 620 may take into account the effects of using different positive power supply voltages and/or body bias voltages and, through appropriate selection of power supply and body bias levels, circuit resource assignments, and placement decisions, reduce power consumption while satisfying design constraints.

At step 710, a resulting final netlist may be processed further by performing a timing analysis using tools 678. The timing analysis may be used to help ensure that the final netlist satisfies timing constraints. If desired, processing may optionally loop back to step 708 to perform additional optimizations using the final netlist. For example, design system 560 may identify routing paths in the final netlist that fail timing constraints and determine replacement routing paths by returning to step 708.

The final netlist may be processed further during an assembly process to produce a configuration data file output 712 (e.g., a .pof or .sof file). The configuration data file output may then be loaded onto interposer 108 using circuitry of the type that is described in connection with FIG. 11.

Figure 15:
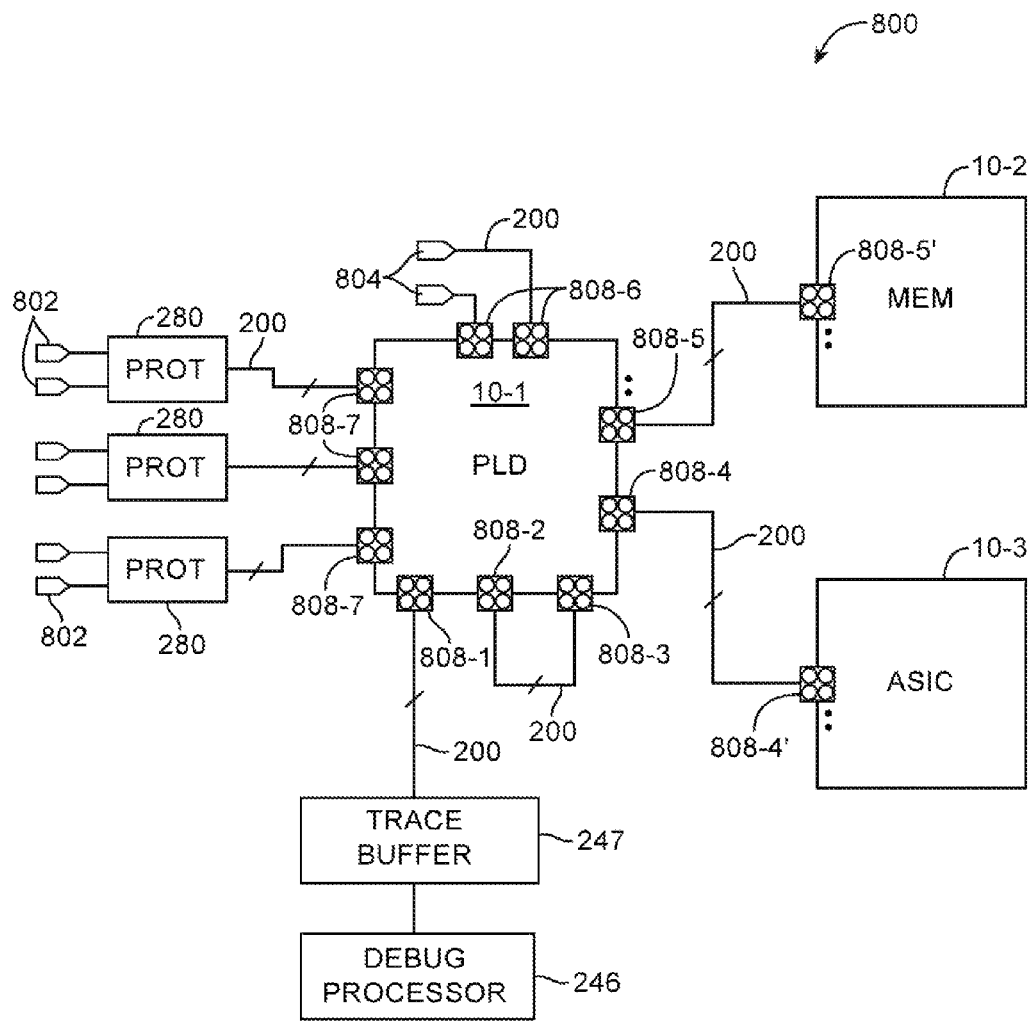
FIG. 15 is an illustrative schematic input screen that may be presented to provide a user with an opportunity to pull standardized die footprints from a predefined library, to make connections between different devices, to specify package pin placement, and to set other desired settings in accordance with an embodiment of the present invention.

In another embodiment of the present invention, design and constraint entry tools 664 may include a schematic capture tool that can be used to specify the desired circuit connections 700. A schematic capture tool may allow the circuit designer to visually construct different parts of a multichip package. FIG. 15 shows an illustrative schematic view of a multichip package system 800 that can be displayed to the circuit designer with the schematic capture tool. As shown in FIG. 15, system 800 may include a first integrated circuit die 10-1 (e.g., a programmable logic device integrated circuit die), a second integrated circuit die 10-2 (e.g., a memory device), and a third integrated circuit die 10-3 (e.g., an application specific integrated circuit die such as a network processing unit). Dies 10-1, 10-2, and 10-3 may be mounted on configurable interposer 108 that is being designed using the schematic capture tool.

In the example of FIG. 15, die 10-1 may interface with interposer 108 via footprints 808-1, 808-2, 808-3, 808-4, 808-5, 808-6, and 808-7 (e.g., a single die may interface with interposer 108 using a set of multiple standard die footprints). Footprints 808-1, 808-2, 808-3, 808-4, 808-5, 808-6, and 808-7 may be selected from the standard footprints library 704 (as an example).

Input-output pins associated with footprint 808-1 may be coupled to debug processor 246 via trace buffer 247 using interposer programmable interconnect paths 200.

Processor 246 and buffer 247 may be embedded in interposer 108, as described in connection with FIG. 8. Input-output pins associated with footprints 808-2 and 808-3 may be used for self-routing connections. Input-output pins associated with footprint 808-4 may be coupled to die 10-3 via corresponding standard footprint 808-4' using programmable interconnect paths 200 (e.g., die 10-3 may interface with interposer 108 via footprint 808-4'). Input-output pins associated with footprint 808-5 may be coupled to die 10-2 via corresponding standard footprint 808-5' using programmable interconnect paths 200 (e.g., die 10-2 may interface with interposer 108 using footprint 808-5'). Input-output pins associated with footprints 808-6 may be used to interact directly with off-interposer devices via pins 804. Input-output pins associated with footprints 808-7 may be used to communicate with off-interposer networking devices via protocol-implementing interface circuits 280 and pins 802. Interface circuits 280 may be configured to implement desired communications protocol(s) and may be embedded in interposer 108 (as an example).

The different processing blocks such as blocks representing dies 10-1, 10-2, and 10-3, debug circuitry 246-247, and input-output interface circuits 280 may represent intellectual property (IP) blocks that are imported into the schematic capture tool (as part of an IP library that can be stored in database(s) 630) for use in designing an interposer that has to interact with these different IP blocks.

In general, footprints 808 represent pinout arrangements for the microbump interface between interposer 108 and on-interposer devices, whereas pins 802 and 804 represent pinout arrangements for the flip-chip bump interface between interposer 108 and the package substrate. The schematic capture tool of this type may therefore be used to specify the desired interposer routing connections that should be made using the programmable interposer interconnect fabric. This schematic description may be translated into an initial netlist and provided to tools 674 for synthesis. A schematic capture tool of this type may enable the system designer to experiment with various device floorplans and make desired connections between different components (in software) so as to enhance system performance.

System 800 of FIG. 15 is merely illustrative. A schematic capture tool configured in this way may enable a system designer to experiment with various device floorplans (in software) so as to optimize system performance. If desired, the schematic capture tool may be used to design an interposer that includes any number of on-interposer devices, interposer-embedded devices, and other suitable circuitry that are interconnected via standardized footprints using programmable interconnect circuitry 200 on the interposer.

Figure 18:
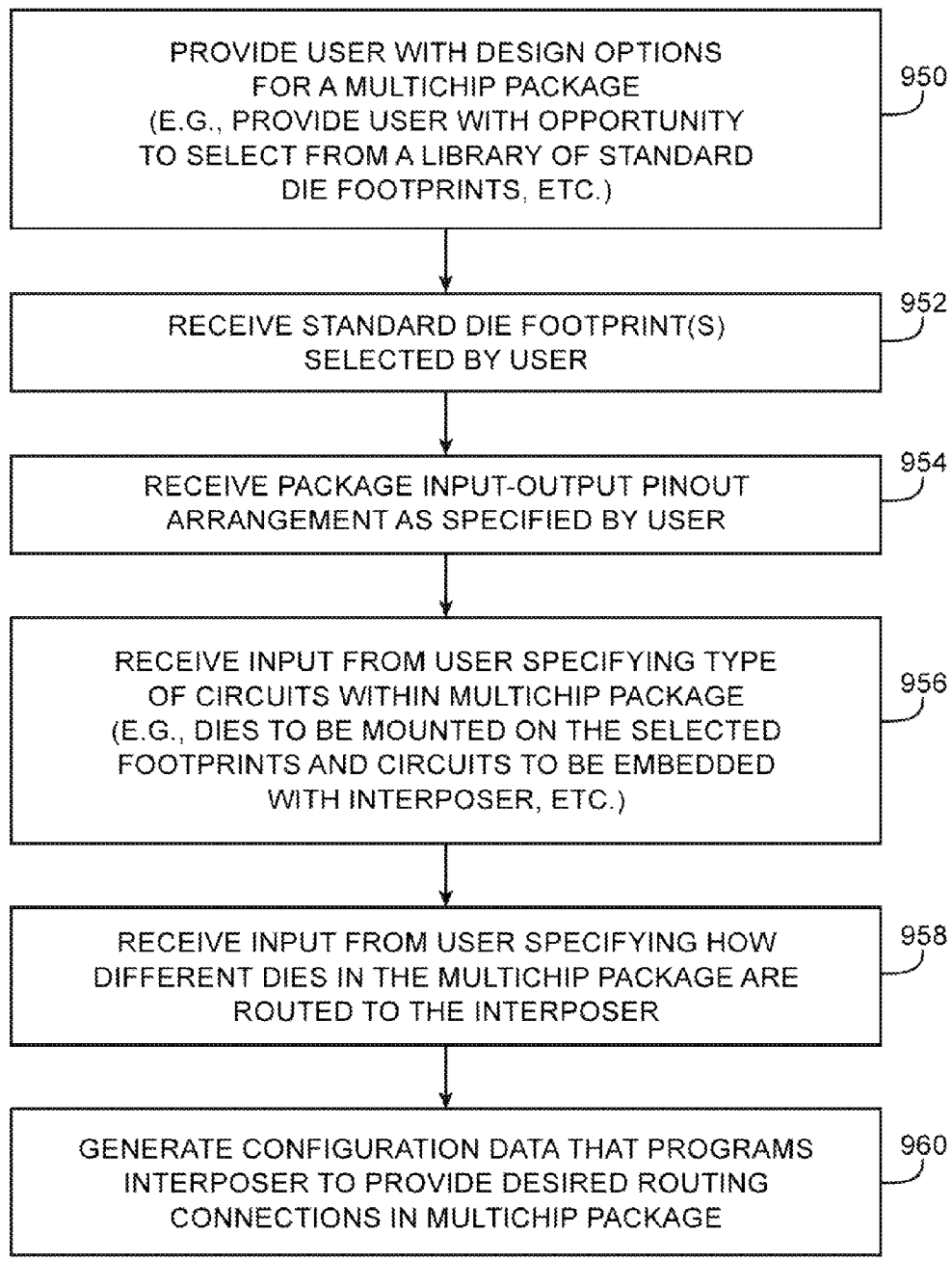
FIG. 18 is a flow chart of illustrative steps for designing a programmable interposer in accordance with an embodiment of the present invention.

FIG. 18 is a flow chart of illustrative steps involved in designing programmable interposer 108 using computer-aided design tools 620. At step 950, tools 620 may provide a system user with options for designing multichip package 100. For example, the user may be provided with an opportunity to select from a library of standard die footprints that serve as an interface between interposer 108 and multiple dies 10 that are housed within package 100.

At step 952, tools 620 may receive at least one standard die footprint that has been selected by the user. The selected die footprint may specify a corresponding predetermined input-output pinout arrangement for a family of integrated circuit devices.

At step 954, tools 620 may receive input from the user that specifies input-output pins for the multichip package (e.g., user input that specifies the package pinout to the PCB).

At step 956, tools 620 may receive input from the user that specifies the type of circuits to be included within package 100 (e.g., the type of dies to be mounted on each of the selected die footprints, the type of circuits that are embedded within interposer 108, etc.).

At step 958, tools 620 may receive input from the user that specifies how the different dies in package 100 are routed to interposer 108. In general, user input obtained during steps 952, 954, 956, and 958 may be received in any suitable order.

At step 960, tools 620 may generate configuration data for configuring programmable interposer 108 so that interposer 108 provides the desired routing connections for the multiple integrated circuit dies within package 100. Such routing connections can include routing connections between the different on-interposer dies 10, routing connections between one or more on-interposer dies 10 and package pins 124, and routing connections between one or more on-interposer dies 10 and interposer-embedded circuits. In certain embodiments, the routing connections may include a direct wired connection (without any intervening switches), a connection through one or more buffers embedded within interposer 108 (e.g., buffer circuits for driving signals between different on-interposer dies and for driving signals between the on-interposer dies and the package pins), and a connection routed through one or more non-configurable blocks embedded within interposer 108.

The use of a programmable interposer device designed in this way may enable maximum integration of multiple, different integrated circuit dies for optimum PCB footprint conservation. This is particularly desirably when different integrated circuit designs are scaled across multiple stacked (or 3D) interposers in a single system. In other words, the use of a programmable interposer may promote a best-fit PCB system interconnect, as the programmable interposer provides an abstraction layer from the actual die I/O pin assignments.

The use of a programmable interconnect also allows the system user freely re-route the microbump pads to the PCB bonding pads as appropriate. This enables the programmable interposer to accommodate multiple integrated circuit dies each with unique power/ground pinout requirements and enables dies manufactured using various process geometries to coexist. Moreover, the use of microbumps for interfacing with the different dies in a multichip package facilitates a high-density/high-integrity inter-device signal interconnect solution. For example, high-density microbump interconnects may enable higher bandwidth signaling that would not otherwise have been possible on a standard PCB implementation lacking an interposer structure.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. An interposer integrated circuit, comprising:
   a plurality of input-output pins that interfaces with a plurality of integrated circuits which are mounted on the interposer integrated circuit; and
   programmable interconnect circuitry that is coupled to the plurality of input-output pins and that serves to provide routing connections for the plurality of integrated circuits.

2. The interposer integrated circuit defined in claim 1, wherein at least a portion of the plurality input-output pins is coupled to the plurality of integrated circuits via microbumps.

3. The interposer integrated circuit defined in claim 2, wherein at least another portion of the plurality of input-output pins is coupled to flip-chip bumps, and wherein the flip-chip bumps are larger than the microbumps.

4. The interposer integrated circuit defined in claim 1, wherein the programmable interconnect circuitry comprises a plurality of routing paths and a plurality of configurable multiplexing circuits interposed in the plurality of routing paths.

5. The interposer integrated circuit defined in claim 4, further comprising:
   a plurality of memory elements that stores configuration data bits for controlling the plurality of configurable multiplexing circuits.

6. The interposer integrated circuit defined in claim 5, further comprising:
   a configuration controller that loads the configuration data bits into the plurality of memory elements.

7. The interposer integrated circuit defined in claim 1, wherein the programmable interconnect circuitry includes at least one self-routing path coupled between input-output pins associated with a selected one of the plurality of integrated circuits.

8. The interposer integrated circuit defined in claim 1, further comprising:
   active processing circuitry embedded as an integral part of the interposer integrated circuit.

9. The interposer integrated circuit defined in claim 8, wherein the active processing circuitry comprises a debug processor.

10. The interposer integrated circuit defined in claim 8, wherein the active processing circuitry includes an interface circuit configured to implement an input-output communications protocol.

11. A multichip package, comprising:
a package housing;
a plurality of integrated circuits in the package housing; and
a configurable interposer on which the plurality of integrated circuits are mounted, wherein the configurable interposer includes programmable interconnect routing circuitry that serves to perform signal routing for the plurality of integrated circuits.

12. The multichip package defined in claim 11, further comprising:
a package substrate on which the configurable interposer is mounted;
a plurality of flip-chip bumps interposed between the configurable interposer and the package substrate; and
a plurality of microbumps interposed between the configurable interposer and the plurality of integrated circuits.

13. The multichip package defined in claim 11, further comprising:
an additional configurable interposer that is stacked on top of the configurable interposer; and
another plurality of integrated circuits that are mounted on the additional configurable interposer in the package housing.

14. The multichip package defined in claim 11, wherein a given integrated circuit in the plurality of integrated circuits includes logic circuits and debugging circuitry, and wherein the logic circuits generate user signals that are conveyed to the debugging circuitry via at least one signal routing path in the programmable interconnect routing circuitry.

15. The multichip package defined in claim 11, wherein a first integrated circuit in the plurality of integrated circuits includes logic circuits, wherein a second integrated circuit in the plurality of integrated circuits comprises a debug processor, and wherein the logic circuits of the first integrated circuit generate user signals that are conveyed to the debug processor via at least one signal routing path in the programmable interconnect routing circuitry.

16. The multichip package defined in claim 11, wherein a given integrated circuit in the plurality of integrated circuits includes logic circuits, wherein the configurable interposer further includes debug logic embedded as an integral part of the configurable interposer, and wherein the logic circuits in the given integrated circuit generate user signals that are conveyed to the interposer-embedded debug logic via at least one signal routing path in the programmable interconnect routing circuitry.

17. The multichip package defined in claim 11, further comprising:
debug circuitry, wherein a given integrated circuit in the plurality of integrated circuits includes logic circuits that generate test signals that are conveyed to the debug circuitry via a trace buffer.

18. A method for designing a multichip package using a circuit design tool implemented on computing equipment, wherein the multichip package includes a plurality of integrated circuits mounted on an interposer, the method comprising:
receiving a first input from a user that specifies how the plurality of integrated circuits is routed to the interposer;
receiving a second input from the user that specifies input-output pins for the multichip package; and
performing routing connections for the plurality of integrated circuits using programmable interconnect circuitry in the interposer based on the first and second user inputs.

19. The method defined in claim 18, further comprising:
providing the user with an opportunity to select from a library of standard die footprints that serve as an interface between the interposer and the plurality of integrated circuits; and
receiving at least one standard die footprint that is selected by the user.

20. The method defined in claim 18, further comprising:
generating configuration data for configuring the programmable interconnect circuitry so that the programmable interconnect circuitry provides desired routing connections for the plurality of integrated circuits.

21. The method defined in claim 18, further comprising:
receiving additional input from the user that specifies circuits that are embedded within the interposer.

* * * * *